United States Patent
Yuan et al.

(10) Patent No.: US 11,431,311 B2
(45) Date of Patent: Aug. 30, 2022

(54) HIGH-LINEARITY VARIABLE GAIN AMPLIFIER AND ELECTRONIC APPARATUS

(71) Applicant: Huawei Technologies Co., Ltd., Shenzhen (CN)

(72) Inventors: Cheng Yuan, Shanghai (CN); Rong Peng, Shanghai (CN); Qingyou Zheng, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/215,447

(22) Filed: Mar. 29, 2021

(65) Prior Publication Data
US 2021/0218379 A1 Jul. 15, 2021

Related U.S. Application Data

(63) Continuation of application No. PCT/CN2019/108955, filed on Sep. 29, 2019.

(30) Foreign Application Priority Data

Sep. 30, 2018 (CN) .......................... 201811161327.1

(51) Int. Cl.
*H03G 3/30* (2006.01)
*H03F 3/45* (2006.01)
(Continued)

(52) U.S. Cl.
CPC ....... *H03G 3/3036* (2013.01); *H03F 3/45076* (2013.01); *H04B 1/0064* (2013.01);
(Continued)

(58) Field of Classification Search
CPC .... H03F 1/22; H03F 1/3211; H03F 2200/294; H03F 2200/451; H03F 3/19; H03F 3/245;
(Continued)

(56) References Cited

U.S. PATENT DOCUMENTS

| 7,323,937 B2 | 1/2008 | Ooya et al. |
| 7,482,879 B2 | 1/2009 | Koutani et al. |

(Continued)

FOREIGN PATENT DOCUMENTS

| CN | 1619950 A | 5/2005 |
| CN | 1682439 A | 10/2005 |

(Continued)

OTHER PUBLICATIONS

Razavi, B., "Design of Analog CMOS Integrated Circuits," McGraw-Hill International Edition, 2001, 706 pages.
(Continued)

*Primary Examiner* — Nguyen T Vo
(74) *Attorney, Agent, or Firm* — Slater Matsil, LLP

(57) ABSTRACT

A variable gain amplifier and an electronic apparatus. The variable gain amplifier includes a first transconductance stage circuit and a second transconductance stage circuit, where the first transconductance stage circuit includes a first amplifying circuit and a second amplifying circuit, the second transconductance stage circuit includes a third amplifying circuit and a fourth amplifying circuit, the first amplifying circuit and the fourth amplifying circuit form a differential input pair, and the second amplifying circuit and the third amplifying circuit form a differential input pair, and where each amplifying circuit of the first amplifying circuit, the second amplifying circuit, the third amplifying circuit, and the fourth amplifying circuit includes a plurality of parallel transistors, and bias control of the plurality of transistors is independent of each other.

20 Claims, 12 Drawing Sheets

(51) Int. Cl.
*H04B 1/00* (2006.01)
*H04B 7/0413* (2017.01)
*H04B 7/06* (2006.01)
*H04B 7/08* (2006.01)

(52) U.S. Cl.
CPC ..... *H04B 7/0413* (2013.01); *H03F 2200/294* (2013.01); *H03F 2200/451* (2013.01); *H03G 2201/103* (2013.01); *H04B 7/0615* (2013.01); *H04B 7/0885* (2013.01)

(58) Field of Classification Search
CPC ...... H03F 3/45076; H03F 3/4508; H03F 3/68; H03G 1/0023; H03G 1/0029; H03G 1/0088; H03G 2201/103; H03G 3/001; H03G 3/3036; H04B 1/0064; H04B 7/0413; H04B 7/0615; H04B 7/0885
See application file for complete search history.

(56) References Cited

U.S. PATENT DOCUMENTS

| | | | |
|---|---|---|---|
| 7,602,246 | B2 | 10/2009 | Zhang et al. |
| 8,698,560 | B2 | 4/2014 | Li et al. |
| 8,736,370 | B2 | 5/2014 | Chiu |
| 8,880,013 | B2 | 11/2014 | Chehrazi et al. |
| 9,143,111 | B2 | 9/2015 | Yoshikawa |
| 9,654,075 | B2 | 5/2017 | Arayashiki et al. |
| 10,404,228 | B2 | 9/2019 | Maruyama et al. |
| 11,323,081 | B2* | 5/2022 | Arayashiki ............. H03F 3/211 |
| 2003/0137352 | A1 | 7/2003 | Youn et al. |
| 2005/0030108 | A1 | 2/2005 | Duncan et al. |
| 2009/0140812 | A1* | 6/2009 | Deng ..................... H03F 1/086 330/277 |
| 2010/0237949 | A1 | 9/2010 | Afashi et al. |
| 2013/0147557 | A1 | 6/2013 | Chiu |
| 2013/0300502 | A1 | 11/2013 | Li et al. |
| 2017/0117863 | A1* | 4/2017 | Tanaka ................. H04B 10/501 |

FOREIGN PATENT DOCUMENTS

| | | |
|---|---|---|
| CN | 1893262 A | 1/2007 |
| CN | 101043203 A | 9/2007 |
| CN | 101826843 A | 9/2010 |
| CN | 102130660 A | 7/2011 |
| CN | 102457240 A | 5/2012 |
| CN | 102545786 A | 7/2012 |
| CN | 103107791 A | 5/2013 |
| CN | 103391049 A | 11/2013 |
| CN | 103457546 A | 12/2013 |
| CN | 103532503 A | 1/2014 |
| CN | 104901629 A | 9/2015 |
| CN | 105207636 A | 12/2015 |
| CN | 205566227 U | 9/2016 |
| CN | 106067767 A | 11/2016 |
| CN | 106100598 A | 11/2016 |
| CN | 108352815 A | 7/2018 |
| JP | 2010199840 A | 9/2010 |
| JP | 5093149 B2 | 12/2012 |

OTHER PUBLICATIONS

Kuo, J.L. et al., "60-GHz Four-Element Phased-Array Transmit/Receive System-in-Package Using Phase Compensation Techniques in 65-nm Flip-Chip CMOS Process," IEEE Transactions on Microwave Theory and Techniques, vol. 60, No. 3, Mar. 2012, 14 pages.

Longdong Xiang, "Research and Design of SiGe BiCMOS Ultra Wideband Variable Gain Amplifier," A thesis submitted to Xidian University in partial fulfillment of the requirements for the degree of Master in Electronic Science and Technology, Nov. 2014, 83 pages (with English Abstract).

Sadhu, B. et al., "A 28GHz SiGe BiCMOS Phase Invariant VGA," 2016 IEEE Radio Frequency Integrated Circuits Symposium, RMO2D-4, Jul. 11, 2016, 4 pages.

* cited by examiner

HIGH-LINEARITY VARIABLE GAIN AMPLIFIER AND ELECTRONIC APPARATUS

CROSS-REFERENCE TO RELATED APPLICATIONS

This application is a continuation of International Application No. PCT/CN2019/108955, filed on Sep. 29, 2019, which claims priority to Chinese Patent Application No. 201811161327.1, filed on Sep. 30, 2018. The disclosures of the aforementioned applications are hereby incorporated by reference in their entireties.

TECHNICAL FIELD

This application relates to the field of electronic technologies, and in particular, to a high-linearity variable gain amplifier and an electronic apparatus.

BACKGROUND

An automatic gain control (AGC) system is widely applied to electronic products such as a communications product, a storage device, and a wireless transceiver. In the AGC system, a variable gain amplifier (VGA) is usually used to amplify input signals of different amplitudes, to output a signal of a constant amplitude at an output end of the VGA.

As the fifth generation mobile communications (5G) technology develops, multiple-input multiple-output (MIMO) technologies such as phased array antennas will be widely used. Accordingly, an array antenna technology imposes new requirements on performance of the VGA. In addition to a gain control function, a function of keeping an output phase constant in different gain states is required.

In the prior art, to effectively control a VGA gain, the following two VGA structures are commonly used.

A first type is a current steering variable gain amplifier.

As shown in FIG. 1, I represents a current source, R is a pull-up resistor, and $Q_0$ to $Q_{n1}$ and $Q_{1N}$ to $Q_{2N}$ represent transistors (such as a triode or a metal-oxide semiconductor (MOS) transistor). A working principle of the VGA is as follows. Signal splitting is implemented by controlling conduction and cutoff of each cascode transistor (for example, $Q_0$ to $Q_{2N}$) in a VGA circuit, to effectively control an amplifier gain.

However, in different gain states, because a quantity of cascode transistors connected to an output node A of the VGA is different, output capacitance at the output node A of the VGA changes with the VGA gain. As a result, an output phase of the VGA continuously changes with the amplifier gain, and therefore the output phase cannot be kept constant in the different gain states.

A second type is a bias-controlled variable gain amplifier.

As shown in FIG. 2, R represents a bias resistor, $Q_1$ and $Q_2$ represent transistors (such as a triode or a MOS transistor), and $V_{b1}$ represents a bias voltage. A working principle of the VGA may be as follows. An output current of the VGA is controlled by changing the bias voltage $V_{b1}$ of the $Q_1$, to control transconductance of an input stage of the VGA, and effective control on a VGA gain is implemented.

However, because a junction capacitor and a parasitic capacitor of a transistor have different capacitance values in the case of different bias currents, an output phase of the VGA changes with the bias current. Similarly, there is a problem that the output phase cannot be kept constant in different gain states.

In a patent application (Application No. 201610379333.9) filed with the China Intellectual Property Administration on May 31, 2016, the applicant proposes a solution of adding a phase compensation network to an input stage of a variable gain amplifier, to ensure that an output phase of the variable gain amplifier is constant in different gain states.

The applicant further studies and finds that this solution has a problem that linearity deteriorates as a gain is switched, and the problem becomes more serious as a frequency increases. Therefore, a VGA that can prevent the linearity from deteriorating with a gain change needs to be designed urgently, to meet a requirement of the 5G technology for a constant phase.

SUMMARY

Embodiments of this application provide a circuit structure of a new variable gain amplifier, so that the variable gain amplifier can have relatively good linearity in different gain states. This ensures that an output phase of the variable gain amplifier is constant.

According to a first aspect, an embodiment of this application provides a variable gain amplifier, including a first transconductance stage circuit and a second transconductance stage circuit. The first transconductance stage circuit includes a first amplifying circuit and a second amplifying circuit. The second transconductance stage circuit includes a third amplifying circuit and a fourth amplifying circuit. The first amplifying circuit and the fourth amplifying circuit form a differential input pair, and the second amplifying circuit and the third amplifying circuit form a differential input pair. Each amplifying circuit of the first amplifying circuit, the second amplifying circuit, the third amplifying circuit, and the fourth amplifying circuit includes a plurality of parallel transistors, and bias control of the plurality of transistors is independent of each other.

In this application, the first amplifying circuit, the second amplifying circuit, the third amplifying circuit, or the fourth amplifying circuit is separately split into a plurality of small-sized parallel transistors. Bias control is independently performed on each transistor. When a variable gain amplifier gain decreases from a maximum gain state, linearity of a variable gain amplifier is mainly determined by an amplifying circuit with a relatively small bias current in the differential input pair. The amplifying circuit is split from a conventional transistor into the plurality of small-sized parallel transistors, linearity of a small-sized transistor is better than that of a large-sized transistor. In this way, a problem of linearity deterioration of the variable gain amplifier in different gain states can be resolved. This improves the linearity, and further ensures that a phase of an output signal of the variable gain amplifier is kept constant.

In a possible implementation, a quantity of the parallel transistors in each amplifying circuit is 2N, where N is a positive integer.

In a possible implementation, the first amplifying circuit, the second amplifying circuit, the third amplifying circuit, and the fourth amplifying circuit have a same structure. By symmetrically designing the amplifying circuits, consistency of a dynamic gain curve of the variable gain amplifier can be kept.

In a possible implementation, bias currents separately output by the first amplifying circuit, the second amplifying circuit, the third amplifying circuit, and the fourth amplifying circuit meet the following condition: $|i_{p2}+i_{n1}|=|i_{n2}+i_{p1}|=C$. $i_{p1}$ is the bias current output by the first amplifying circuit, $i_{p2}$ is the bias current output by the second amplifying circuit, $i_{n1}$ is the bias current output by the third amplifying circuit, $i_{n2}$ is the bias current output by the fourth amplifying circuit, and C is a constant.

Based on the foregoing possible implementation, in a possible implementation, when the variable gain amplifier gain is switched, in any differential input pair formed by the first amplifying circuit and the fourth amplifying circuit or formed by the second amplifying circuit and the third amplifying circuit, the bias current of one amplifying circuit decrements, while the bias current of the other amplifying circuit increments. By adopting such a current distribution policy, when a gain state of the variable gain amplifier changes, a problem that there is a dent when the linearity of the VGA changes with the gain can be avoided as much as possible. This improves the linearity of the VGA within a dynamic gain range.

In a possible implementation, a variation of the bias current is constant when the bias current increments or decrements.

In a possible implementation, when a dynamic range of gain switching is relatively large, a variation of the bias current of the variable gain amplifier is less than a variation of the bias current of the variable gain amplifier when the dynamic range of the gain switching is relatively small. Linear gain adjustment can be implemented by using a current distribution policy of unequal current step.

In a possible implementation, the variable gain amplifier further includes a first degeneration circuit and a second degeneration circuit. The first degeneration circuit is configured to change linearity of a bias current output by each transistor in the first transconductance stage circuit. The second degeneration circuit is configured to change linearity of a bias current output by each transistor in the second transconductance stage circuit. By improving linearity of the output signal of the entire variable gain amplifier through the two degeneration circuits, a transconductance gain of the variable gain amplifier may change linearly with a bias voltage as much as possible.

In a possible implementation, either of the first degeneration circuit and the second degeneration circuit includes at least one of a resistor or an inductor.

In a possible implementation, the plurality of transistors are triodes.

In a possible implementation, in each amplifying circuit, bases of the plurality of transistors are configured to separately receive an input voltage. Emitters of the plurality of transistors are separately configured to be couple to ground through the first degeneration circuit or the second degeneration circuit. Collectors of the plurality of transistors are short-circuited together and are configured to output a bias current.

In a possible implementation, the plurality of transistors are metal-oxide semiconductor transistors.

In a possible implementation, in each amplifying circuit, gates of the plurality of transistors are configured to separately receive an input voltage. Sources of the plurality of transistors are separately configured to be coupled to ground through the first degeneration circuit or the second degeneration circuit. Drains of the plurality of transistors are short-circuited together, and are configured to output a bias current.

According to a second aspect, an embodiment of this application provides an electronic apparatus, including a radio frequency front-end, including a plurality of radio frequency channels that one-to-one correspond to a plurality of antennas, where the plurality of radio frequency channels are separately coupled to the plurality of antennas, and each radio frequency channel includes at least one of a radio frequency receive channel or a radio frequency transmit channel, and the radio frequency receive channel or the radio frequency transmit channel separately includes the variable gain amplifier according to any one of the first aspect or the implementations of the first aspect, and a combiner, coupled to the plurality of radio frequency channels.

Because the variable gain amplifier used in this embodiment of this application can maintain relatively good linearity in different gain states, the variable gain amplifier can not only amplify a signal, but also keep a phase of the amplified signal constant. This avoids or reduces deterioration of performance of a phase shifter, to meet a requirement of the electronic apparatus for a constant phase.

In a possible implementation, the radio frequency receive channel further includes a low-noise amplifier, an amplifier, and a phase shifter. An input end of the low-noise amplifier is coupled to an antenna corresponding to the radio frequency receive channel, and an output end of the low-noise amplifier is coupled to an input end of the variable gain amplifier. An output end of the variable gain amplifier is coupled to an input end of the amplifier, and an output end of the amplifier is coupled to an input end of the phase shifter. An output end of the phase shifter is coupled to the combiner.

In a possible implementation, the radio frequency transmit channel further includes a power amplifier, an amplifier, and a phase shifter. An input end of the phase shifter is coupled to the combiner, and an output end of the phase shifter is coupled to an input end of the amplifier. An output end of the amplifier is coupled to an input end of the variable gain amplifier, and an output end of the variable gain amplifier is coupled to an input end of the power amplifier. An output end of the power amplifier is coupled to an antenna corresponding to the radio frequency transmit channel.

In a possible implementation, the electronic apparatus is a phased array receiver, a phased array transmitter, or a phased array transceiver. When the variable gain amplifier provided in this embodiment of this application is combined with a phased array antenna technology, a signal of the electronic apparatus can have good phase stability, to meet a requirement for phase stability and high linearity in application scenarios such as in a 5G scenario and a high-frequency scenario.

In a possible implementation, the electronic apparatus is a mobile phone, a base station, or a personal computer.

Based on the foregoing possible implementation, in a possible implementation, the electronic apparatus includes the plurality of antennas mentioned in the second aspect and the possible implementations of the second aspect.

BRIEF DESCRIPTION OF THE DRAWINGS

To describe the technical solutions in the embodiments of this application more clearly, the following briefly describes the accompanying drawings required for describing the embodiments.

DETAILED DESCRIPTION OF ILLUSTRATIVE EMBODIMENTS

To make objectives, technical solutions, and advantages of this application clearer, the following further describes this application in detail with reference to the accompanying drawings.

Figure 1:
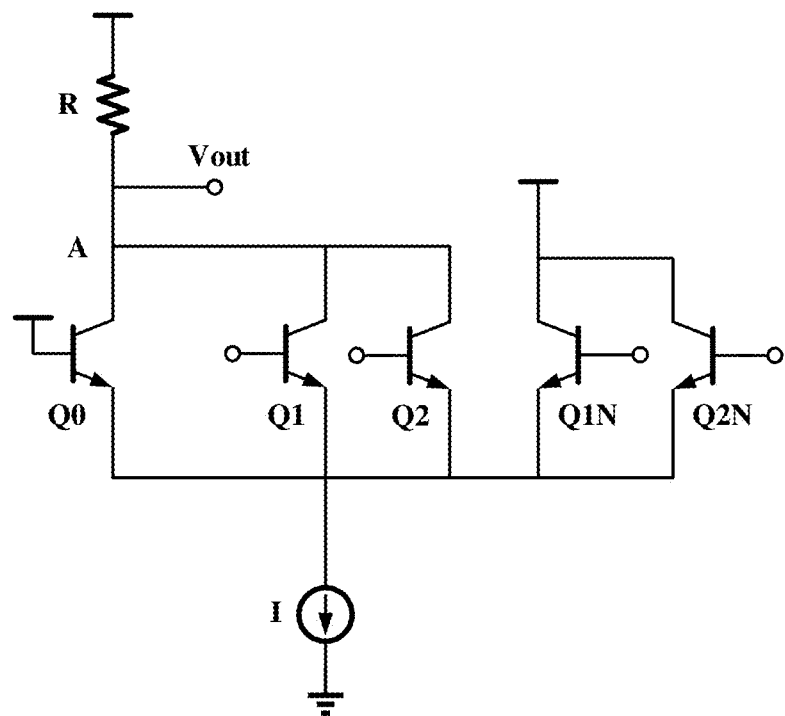
FIG. 1 is a schematic diagram of a structure of a current steering variable gain amplifier in the prior art.
Figure 2:
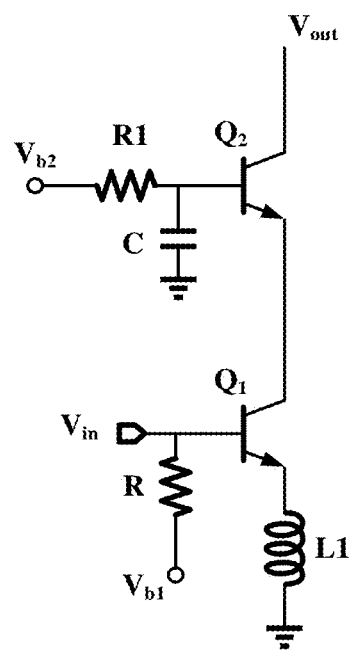
FIG. 2 is a schematic diagram of a structure of a bias-controlled variable gain amplifier in the prior art.
Figure 3A:
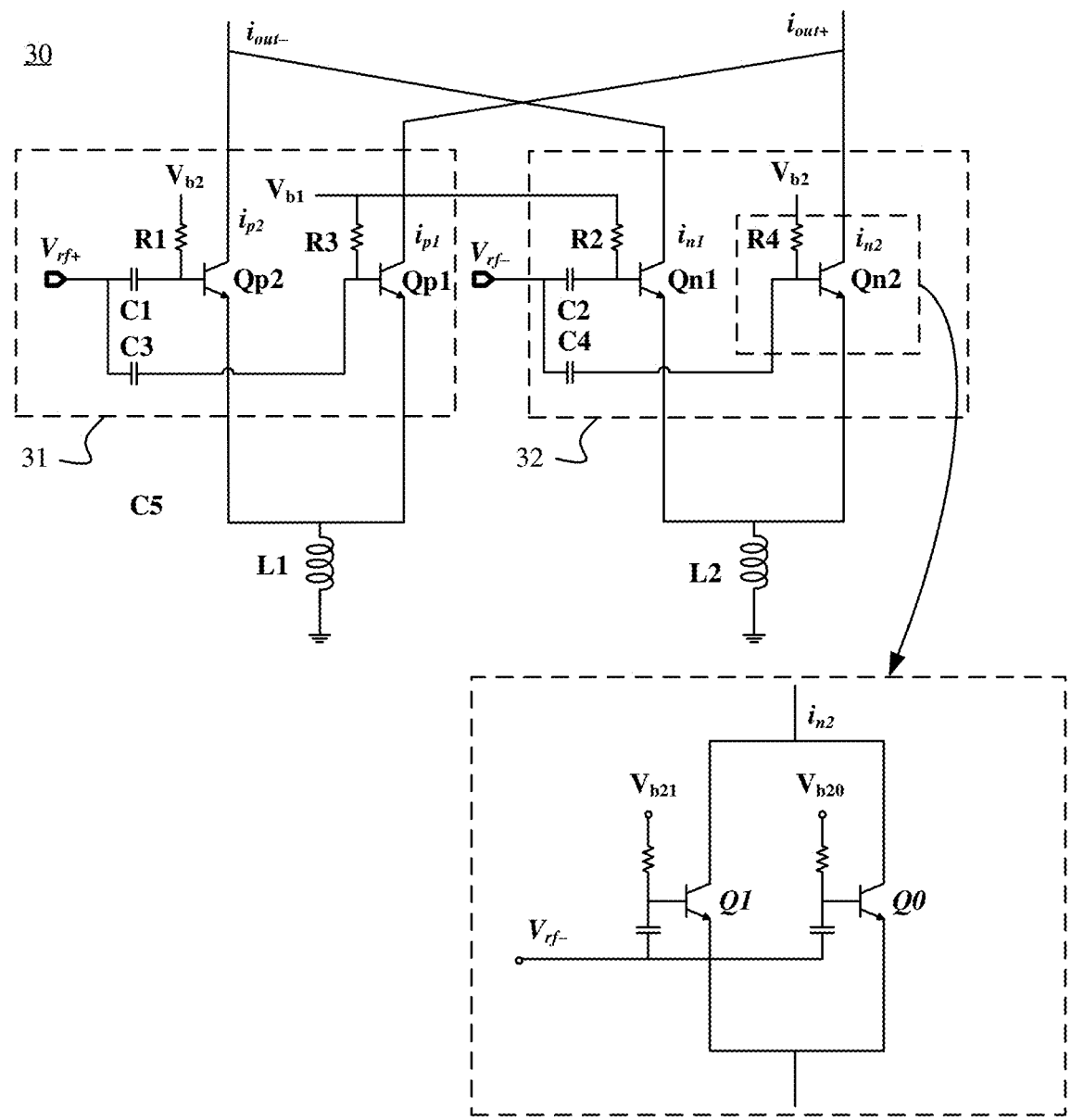
FIG. 3a to FIG. 3c each are schematic diagrams of a structure of a variable gain amplifier according to an embodiment of this application.

Refer to FIG. 3a. An embodiment of this application provides a variable gain amplifier 30. Specifically, as shown in FIG. 3a, the variable gain amplifier 30 may include a first transconductance stage (Gm stage) circuit 31 and a second transconductance stage circuit 32. The first transconductance stage circuit 31 includes a first amplifying circuit $Q_{p1}$ and a second amplifying circuit $Q_{p2}$. The second transconductance stage circuit 32 includes a third amplifying circuit $Q_{n1}$ and a fourth amplifying circuit $Q_{n2}$. The first amplifying circuit $Q_{p1}$ and the fourth amplifying circuit $Q_{n2}$ form a differential input pair, and the second amplifying circuit $Q_{p2}$ and the third amplifying circuit $Q_{n1}$ form a differential input pair. Input ends of the first amplifying circuit $Q_{p1}$ and the second amplifying circuit $Q_{p2}$ separately receive a first voltage $V_{rf+}$ through a direct-current blocking capacitor C1 and a direct-current blocking capacitor C2. The first amplifying circuit $Q_{p1}$ generates a first current $i_{p1}$ based on the first voltage $V_{rf+}$ under control of a first bias voltage $V_{b1}$. The second amplifying circuit $Q_{p2}$ generates a second current $i_{p2}$ based on the first voltage $V_{rf+}$ under control of a second bias voltage $V_{b2}$. Input ends of the third amplifying circuit $Q_{n1}$ and the fourth amplifying circuit $Q_{n2}$ separately receive a second voltage $V_{rf-}$ through direct-current blocking capacitors C3 and C4. The third amplifying circuit $Q_{n1}$ generates a third current $i_{n1}$ based on the second voltage $V_{rf-}$ under control of the first bias voltage $V_{b1}$. The fourth amplifying circuit $Q_{p2}$ generates a fourth current $i_{n2}$ based on the second voltage $V_{rf-}$ under control of the second bias voltage $V_{b2}$.

The first voltage $V_{rf+}$ and the second voltage $V_{rf-}$ are differential input voltages (namely, a pair of symmetric signals that are equal in magnitude but opposite in polarity). Finally, on an output stage of the variable gain amplifier 30, the first current $i_{p1}$ and the fourth current $i_{n2}$ are combined to form a first output current $i_{out+}$, and the second current $i_{p2}$ and the third current $i_{n1}$ are combined to form a second output current $i_{out-}$. The first output current $i_{out+}$ and the second output current $i_{out-}$ are differential output signals. In other words, a current signal finally output by the variable gain amplifier 30 is a difference between the first output current $i_{out+}$ and the second output current $i_{out-}$.

A person skilled in the art should know that a transconductance stage circuit may also be referred to as an operational trans-conductance amplifier (OTA), and is an amplifier that converts an input differential voltage into an output current. A gain of the transconductance stage circuits 31, 32 may be adjusted by changing magnitudes of the first bias voltage $V_{b1}$ and the second bias voltage $V_{b2}$, to adjust magnitude of the output current signal.

In this embodiment, the first amplifying circuit $Q_{p1}$, the second amplifying circuit $Q_{p2}$, the third amplifying circuit $Q_{n1}$, and the fourth circuit $Q_{n2}$ are all symmetrically designed. In other words, structures of the first amplifying circuit $Q_{p1}$, the second amplifying circuit $Q_{p2}$, the third amplifying circuit $Q_{n1}$, and the fourth amplifying circuit $Q_{n2}$ are the same in layout and size, to maintain consistency of a dynamic gain curve (namely, a gain-control voltage/control codeword).

Specifically, any one of the first amplifying circuit $Q_{p1}$, the second amplifying circuit $Q_{p2}$, the third amplifying circuit $Q_{n1}$, and the fourth amplifying circuit $Q_{n2}$ includes a plurality of parallel transistors (which may also be referred to as Gm transistors), and bias control of the plurality of transistors is independent of each other. In a conventional solution, a first amplifying circuit $Q_{p1}$, a second amplifying circuit $Q_{p2}$, a third amplifying circuit $Q_{n1}$, or a fourth amplifying circuit $Q_{n2}$ in a similar transconductance stage circuit is a transistor. However, in this embodiment, the first amplifying circuit $Q_{p1}$, the second amplifying circuit $Q_{p2}$, the third amplifying circuit $Q_{n1}$, or the fourth amplifying circuit $Q_{n2}$ is separately split into a plurality of small-sized parallel transistors. The bias voltage of each transistor is independently controlled. When a variable gain amplifier gain decreases from a maximum gain state, linearity of the variable gain amplifier is mainly determined by an amplifying circuit with a relatively small bias current in the differential input pair. When a current is small, linearity of a small-sized transistor is better than that of a large-sized transistor. Therefore, a conventional amplifying circuit in which a large-sized transistor is used is split into a plurality of small-size transistors, so that a problem of linearity deterioration that occurs when a conventional VGA gain is switched can be resolved. This improves the linearity, and further ensures that a phase of the output signal of the variable gain amplifier is kept constant.

In this embodiment, a quantity of the plurality of parallel transistors in any amplifying circuit and a relative size proportion of the plurality of parallel transistors may be flexibly adjusted based on a design requirement, to improve the linearity to different degrees. This is not specifically limited in this embodiment.

As shown in FIG. 3a, the variable gain amplifier 30 further includes a first degeneration circuit L1 and a second degeneration circuit L2. The first degeneration circuit L1 is configured to change linearity of the output current of each transistor in the first transconductance stage circuit 31. The second degeneration circuit L2 is configured to change linearity of the output current of each transistor in the second transconductance stage circuit 32. By improving linearity of the output signal of the entire variable gain amplifier through the two degeneration circuits, a transconductance gain of the variable gain amplifier may change linearly with the bias voltage as much as possible.

In this embodiment of this application, a degeneration circuit used to improve linearity of an output current of each transistor is introduced, to improve the linearity of the output signal of the variable gain amplifier 30. This enables the transconductance gain of the variable gain amplifier 30 to change linearly with the bias voltage as much as possible.

The first degeneration circuit L1 and the second degeneration circuit L2 each may include at least one of a resistor or an inductor. In other words, in this embodiment of this application, the degeneration circuit L1 or the second degeneration circuit L2 may be a separate resistor, a separate inductor, or a combination of the resistor and the inductor.

For example, FIG. 3a further shows a structure of the fourth amplifying circuit $Q_{n2}$. It should be noted that, for ease of description, FIG. 3a shows only a detailed structure of the fourth amplifying circuit $Q_{n2}$. Because of the structures of the first amplifying circuit $Q_{p1}$, the second amplifying circuit $Q_{p2}$ and the third amplifying circuit $Q_{n1}$ are the same as the structure of the fourth amplifying circuit $Q_{n2}$. Therefore, for the structures of the first amplifying circuit $Q_{p1}$, the second amplifying circuit $Q_{p2}$ and the third amplifying circuit $Q_{n1}$, also refer to the structure of the fourth amplifying circuit $Q_{n2}$ shown in FIG. 3a. In FIG. 3a, the fourth amplifying circuit $Q_{n2}$ includes a first transistor $Q_0$ and a second transistor $Q_1$ that are connected in parallel. Correspondingly, the second bias voltage $V_{b2}$ may include a first bias voltage $V_{b20}$ and a second bias voltage $V_{b21}$. The first bias voltage $V_{b20}$ is used to control a gain of the first transistor $Q_0$, the second bias voltage $V_{b21}$ is used to control a gain of the second transistor $Q_1$, and bias voltages of the first transistor $Q_0$ and the second transistor $Q_1$ are independently controlled.

It should be noted that FIG. 3a further shows bias resistors R1, R2, R3, and R4 that are separately coupled to the differential signal input ends of the amplifying circuits. By changing the first bias voltage $V_{b1}$ or the second bias voltage $V_{b2}$ that is applied on the bias resistors R1, R2, R3 and R4, in other words, bias control may be performed on each amplifying circuit. A person skilled in the art should know that, for example, when the fourth amplifying circuit $Q_{n2}$ includes the first transistor $Q_0$ and the second transistor $Q_1$ that are connected in parallel, the symbol $Q_{n2}$ in FIG. 3a represents an equivalent circuit corresponding to the first transistor $Q_0$ and the second transistor $Q_1$ that are connected in parallel. Correspondingly, symbols such as C4, $V_{b2}$, and R4 separately represent the equivalent direct-current blocking capacitor, the bias voltage, and the bias resistor in the fourth amplifying circuit $Q_{n2}$. In actual application, the direct-current blocking capacitor and the bias resistor are separately disposed at the differential signal input ends of the first transistor $Q_0$ and the second transistor $Q_1$. The bias voltage $V_{b20}$ is applied on a bias resistor corresponding to the first transistor $Q_0$, a bias current output by the first transistor $Q_0$ may be changed. The bias voltage $V_{b21}$ is applied on the bias resistor corresponding to the second transistor $Q_1$, a bias current output by the second transistor $Q_1$ may be changed. This implements gain control of the fourth amplifying circuit $Q_2$. In this application, for ease of description, no symbol is used to mark them in FIG. 3a to FIG. 3c.

In this embodiment, the first transistor $Q_0$ and the second transistor $Q_1$ may be triodes, for example, bipolar junction transistors (BJT). In this case, respective bases of the first transistor $Q_0$ and the second transistor $Q_1$ are separately configured to receive the second voltage $V_{rf}$. After respective collectors of the first transistor $Q_0$ and the second transistor $Q_1$ are short-circuited, the first transistor $Q_0$ and the second transistor $Q_1$ are configured to output the fourth current $i_{n2}$. Respective emitters of the first transistor $Q_0$ and the second transistor $Q_1$ are separately coupled to ground through the second degeneration circuit L2. By changing the bias voltages of the respective bases of the first transistor $Q_0$ and the second transistor $Q_1$, namely, the first bias voltage $V_{b20}$ and the second bias voltage $V_{b21}$, transconductance of the triode can be controlled. This implements the gain control.

Figure 3B:
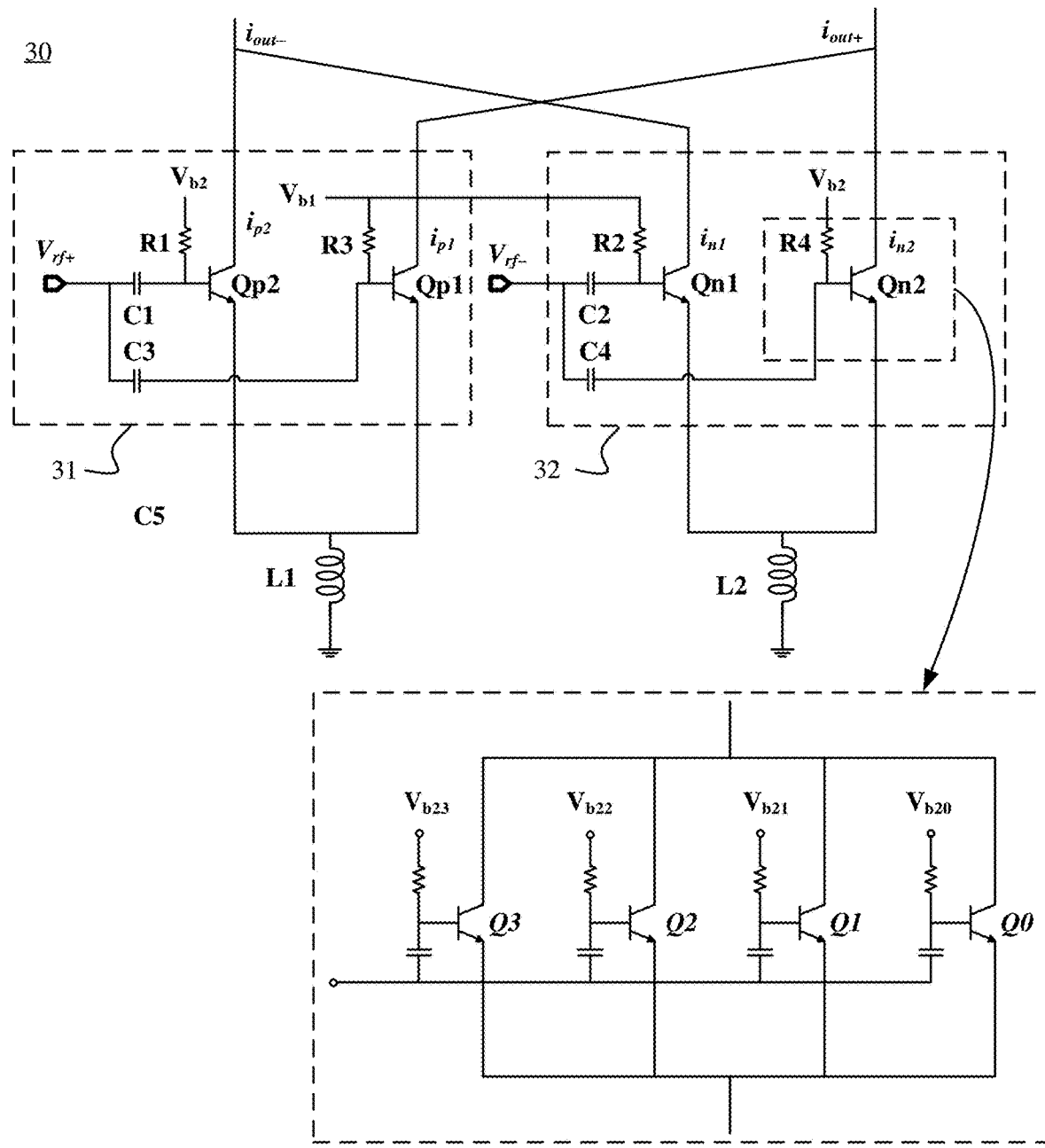

In another implementation, as shown in FIG. 3b, the fourth amplifying circuit $Q_{n2}$ may include the first transistor $Q_0$, the second transistor $Q_1$, a third transistor $Q_2$, and a fourth transistor $Q_3$ that are connected in parallel. It should be understood that the structures of the first amplifying circuit $Q_{p1}$, the second amplifying circuit $Q_{p2}$, and the third amplifying circuit $Q_{n1}$ are also separately the same as the structure of the fourth amplifying circuit $Q_{n2}$. When the first transistor $Q_0$, the second transistor $Q_1$, the third transistor $Q_2$, and the fourth transistor $Q_3$ are all triodes, for a connection relationship among a base, a collector, and an emitter of each triode, refer to FIG. 3a and descriptions of a corresponding embodiment. Details are not described herein again. By independently controlling a base bias voltage (namely, $V_{b20}$, $V_{b21}$, $V_{b22}$, $V_{b23}$) of each triode, transconductance of each triode may be changed. This implements overall gain control of the fourth amplifying circuit $Q_{n2}$. It should be understood that gain control is separately performed on the first amplifying circuit $Q_{p1}$, the second amplifying circuit $Q_{p2}$, the third amplifying circuit $Q_{n1}$, and the fourth amplifying circuit $Q_{n2}$. Finally, an overall gain of the variable gain amplifier 30 may be affected.

Figure 3C:
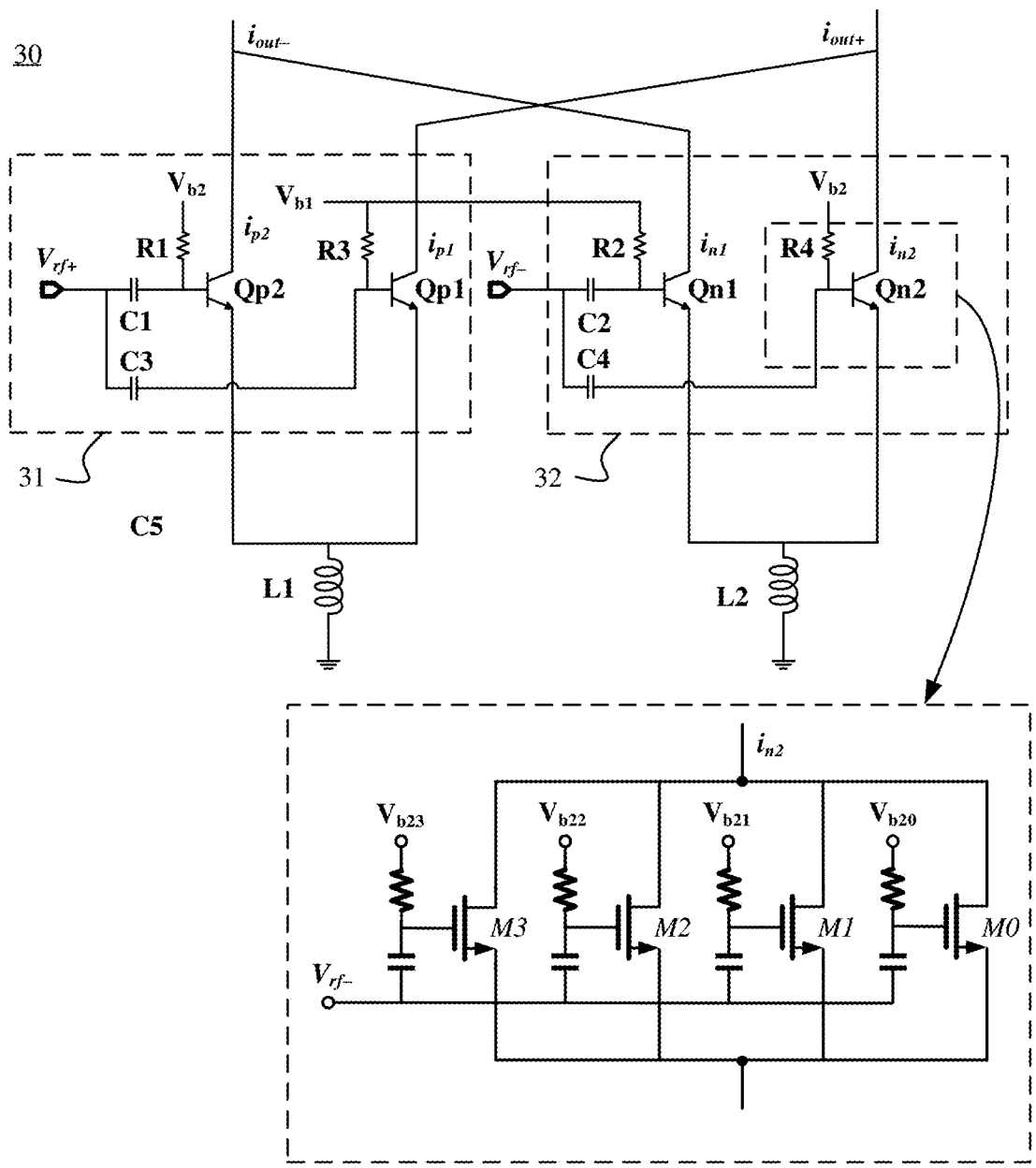

In another implementation, the plurality of parallel transistors in the fourth amplifying circuit $Q_{n2}$ may alternatively be metal-oxide semiconductor (MOS) transistors. As shown in FIG. 3c, for example, a P-channel MOS transistor is used as a transistor. The fourth amplifying circuit $Q_{n2}$ may include four MOS transistors that are connected in parallel. To be distinguished from the triodes in FIG. 3a and FIG. 3b, M0, M1, M2 and M3 are separately used herein to represent the four MOS transistors. In this case, gates of the MOS transistors (M0, M1, M2, and M3) are configured to receive the second voltage $V_{rf-}$. Respective drains of the MOS transistors (M0, M1, M2, and M3) are short-circuited together, and then are configured to combine respective drain currents of the MOS transistors (M0, M1, M2, and M3), to output the fourth current $i_{n2}$. Respective sources of the MOS transistors (M0, M1, M2, and M3) are separately coupled to ground through the second degeneration circuit L2. By changing bias voltages of the gates of the MOS transistors (M0, M1, M2, and M3), namely, $V_{b20}$, $V_{b21}$, $V_{b22}$ and $V_{b23}$, transconductance of each MOS transistor may be controlled. This implements the gain control of the fourth amplifying circuit $Q_{n2}$. For the structures of the first amplifying circuit $Q_{p1}$, the second amplifying circuit $Q_{p2}$, and the third amplifying circuit $Q_{n1}$, refer to the structure of the fourth amplifying circuit $Q_{n2}$. Details are not described again.

To better describe how the variable gain amplifier provided in this embodiment improves the linearity, the following uses a triode as an example to describe a gain control principle of the technical solution of this application. When the MOS transistors are used, a gain control principle of the MOS transistors is similar.

A person skilled in the art should know that, in the triode, a collector current $I_c$ of the triode is closely related to a base voltage of the triode, as shown in formula (1):

$$I_c = I_s * e^{V_{be}/V_t} \quad (1)$$

$I_s$ is a saturation current, $V_{be}$ is a junction voltage between a base and an emitter, and $V_t$ is a thermal voltage, where $$V_T = \frac{kT}{q}.$$

k represents a Boltzmann constant (namely, k=1.386488× $10^{-23}$ J/K), T represents a Fahrenheit temperature, and q represents a quantity of charges of an elementary charge (namely, q=1.602 176 565×$10^{-19}$ C).

Correspondingly, a transconductance gain $g_m$ of the triode may be expressed as:

$$g_m = \partial I_c / \partial V_{be} = I_c / V_t \quad (2)$$

Therefore, the transconductance gain $g_m$ of the triode is proportional to $I_c$.

Figure 4:
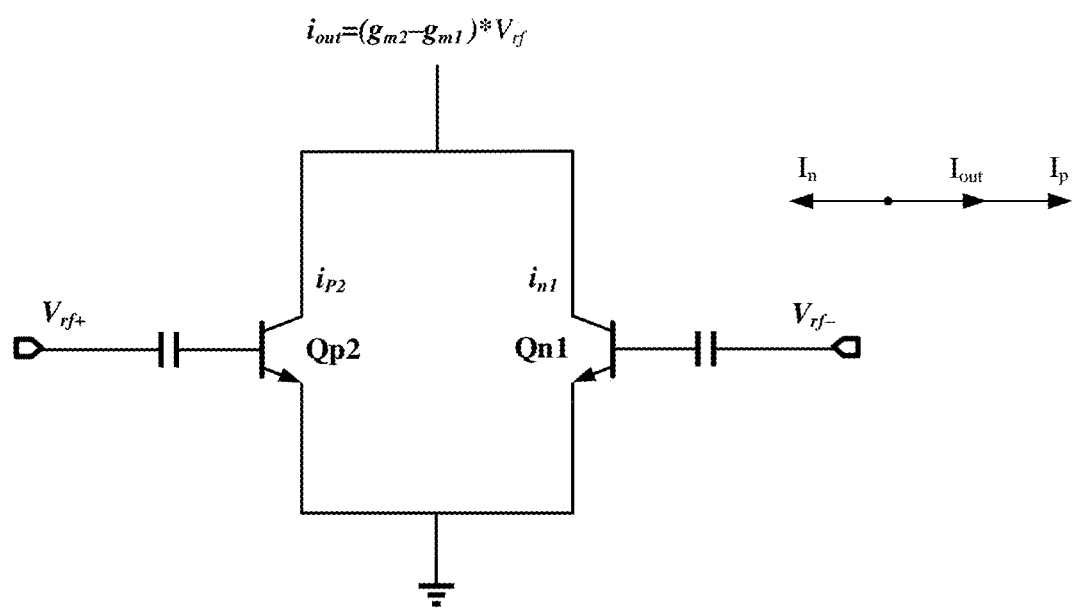
FIG. 4 is a schematic diagram of a structure of a differential input pair of the variable gain amplifier in FIG. 3a to FIG. 3c.

Further, FIG. 4 shows the differential input pair $Q_{p2}$ and $Q_{n1}$ of the variable gain amplifier in FIG. 3a to FIG. 3c. It can be seen that the differential first voltage $V_{rf+}$ and the differential second voltage $V_{rf-}$ are separately input to bases of the differential input pair $Q_{p2}$ and $Q_{n1}$, and at the same time, collectors of the differential input pair $Q_{p2}$ and $Q_{n1}$ are short-circuited. An output current $I_{out}$ of the differential input pair $Q_{p2}$ and $Q_{n1}$ may be expressed as:

$$I_{out} = i_{p2} + i_{n1} = g_{m2} * V_{rf+} + g_{m1} * V_{rf-} = (g_{m2} - g_{m1}) * V_{rf} = (|i_{p2}| - |i_{p1}|) * V_{rf} / V_t \quad (3)$$

$g_{m1}$ is a transconductance gain of $Q_{p2}$, $g_{m2}$ is a transconductance gain of $Q_{n1}$, and $V_{rf} = |V_{rf+}| - |V_{rf-}|$.

It can be seen from formula (3) that, by changing the bias voltages $V_{b1}$ and $V_{b2}$ of respective bases or gates of the differential input pairs $Q_{p2}$ and $Q_{n1}$, magnitudes of the second current $I_{p2}$ and the third current $I_{n1}$ that flow through the differential input pair $Q_{p2}$ and $Q_{n1}$ can be controlled independently. In this way, transconductance of the differential input pair $Q_{p2}$ and $Q_{n1}$ is controlled to implement gain control.

Figure 5:
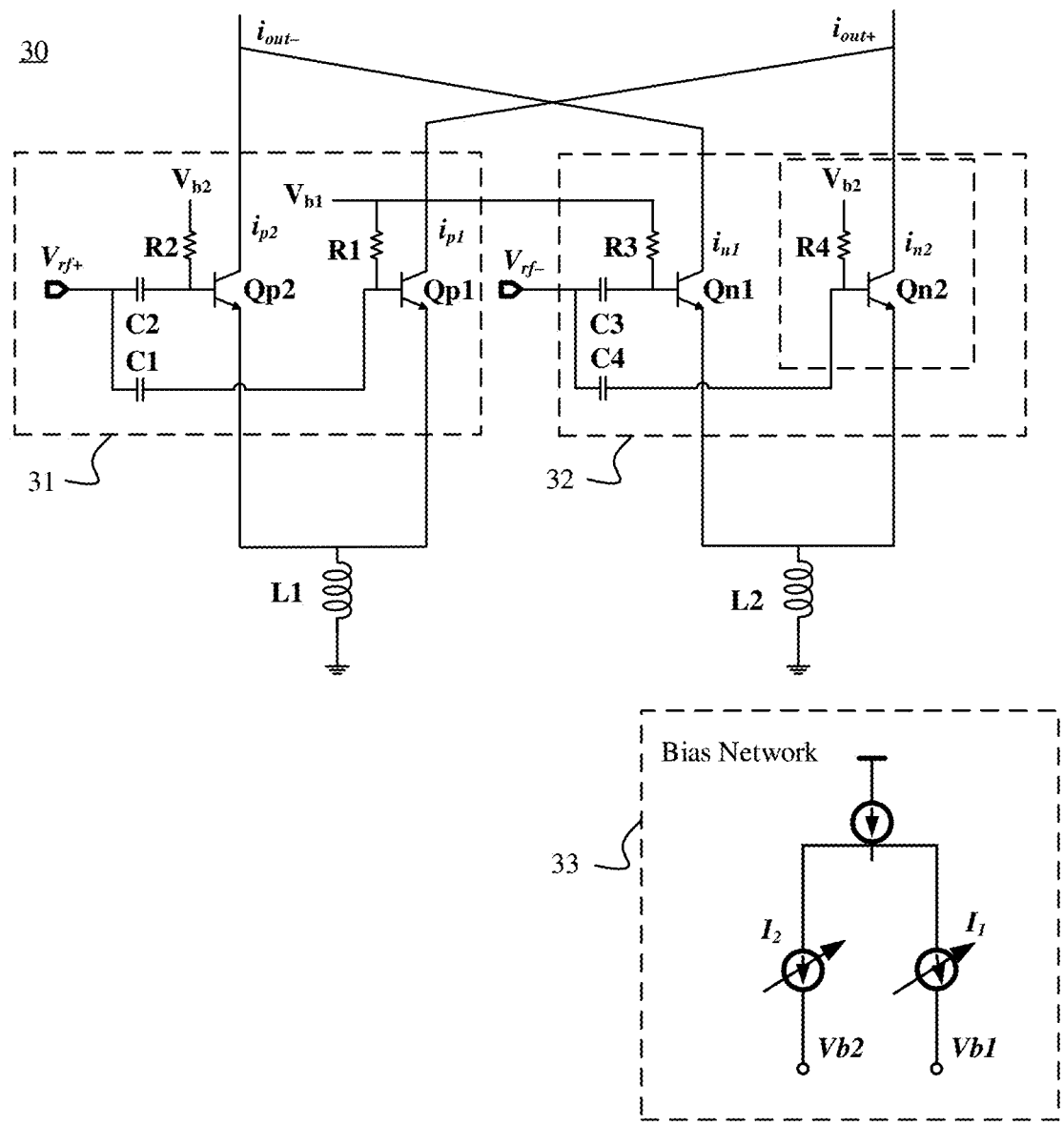
FIG. 5 is a schematic diagram of a structure of another variable gain amplifier according to an embodiment of this application.

Further, refer to FIG. 5. The gain control principle shown in FIG. 4 is further extended to the variable gain amplifiers 30 shown in FIG. 3a to FIG. 3b. It should be noted that a structure of the variable gain amplifier 30 in FIG. 5 is the same as that in FIG. 3a to FIG. 3b, and reference may be made to FIG. 3a to FIG. 3b. A difference lies in that FIG. 5 further shows a bias network 33 configured to provide the bias voltages $V_{b1}$ and $V_{b2}$. For example, by changing magnitudes of currents transmitted by a current source $I_t$ and a current source $I_2$ in the bias network 33 to the bias resistors R1/R3 and R2/R4, the bias voltages $V_{b1}$ and $V_{b2}$ may be controlled.

In this embodiment, a key to implementing the gain control on the variable gain amplifier 30 lies in a current distribution policy. A bias current of the variable gain amplifier 30 meets the following condition:

$$|i_{p2} + i_{n1}| = |i_{n2} + i_{p1}| = C \quad (4)$$

C is a constant, in other words, total currents of $i_{out+}$ and $i_{out-}$ are the same, but polarities of $i_{out+}$ and $i_{out-}$ are opposite.

Correspondingly, a final gain of the variable gain amplifier 40 may be calculated by using formula 5:

$$\text{Gain} \propto \frac{(i_{out+} - i_{out-})}{(V_{rf+} - V_{rf-})} \quad (5)$$

Gain represents a gain of the variable gain amplifier 30.

Theoretically, the gain control may be implemented by controlling a percentage of a current flowing through the second amplifying circuit $Q_{p2}$ (or the fourth amplifying circuit $Q_{n2}$) and the first amplifying circuit $Q_{p1}$ (or the third amplifying circuit $Q_{n1}$). For example, when the current $i_{p2}$ flowing through the second amplifying circuit $Q_{p2}$ is the same as the current $i_{n1}$ flowing through the third amplifying circuit $Q_{n1}$, because of positive and negative cancellation, the current signal $i_{out}$ output by the variable gain amplifier 30 is 0, and the gain is the smallest. When all currents flow through the second amplifying circuit $Q_{p2}$, and when the third amplifying circuit $Q_{n1}$ is turned off, the variable gain amplifier 30 may obtain a maximum gain. It can be seen that the current distribution policy impacts gain adjustment precision and a dynamic range of the variable gain amplifier 30.

In this embodiment, to better control the gain of the variable gain amplifier 30, the following current distribution policy is proposed.

It is assumed that N-bit (bit) gain control needs to be implemented, where N is a positive integer, and each time a gain level is adjusted, a current change amount of a transistor is $I_0$. A bias current relationship of the variable gain amplifier 30 may be expressed as follows:

$$i_{p2} + i_{n1} = i_{n2} + i_{p1} = I_{sum} = 2^N * I_0 \quad (6)$$

For example, when the variable gain amplifier 30 is in the highest gain, the current $i_{p2}$ flowing through the second amplifying circuit $Q_{p2}$ may be $2^N * I_0$. In addition, because the third amplifying circuit $Q_{n1}$ is turned off, the current $i_{n1}$ flowing through the third amplifying circuit $Q_{n1}$ is 0. When $i_{p2} = i_{n1} = 2^{N-1} * I_0$, because $i_{p2}$ and $i_{n1}$ cancel each other out, the variable gain amplifier 30 has no output signal, and therefore the gain is the smallest.

The following uses 6-bit gain control as an example to describe a current change of any differential input pair (for example, $Q_{p2}$ and $Q_{n1}$, or $Q_{p1}$ and $Q_{n2}$) in the variable gain amplifier 30 at each gain level with reference to Table 1. delta_Gain indicates again change relative to the maximum gain (Gmax), Gain_step indicates again adjustment step, and Gmin indicates the minimum gain.

TABLE 1

| Gain state (Gain state) | $I_{p2}/I_{n2}$ | $I_{n1}/I_{p1}$ | $I_{sum}$ | delta_Gain (dB) | Gain_step (dB) |
|---|---|---|---|---|---|
| 1 (Gmax) | 64*$I_0$ | 0 | 64*$I_0$ | 0.000 | 0.000 |
| 2 | 63*$I_0$ | 1*$I_0$ | 64*$I_0$ | −0.276 | −0.276 |
| 3 | 62*$I_0$ | 2*$I_0$ | 64*$I_0$ | −0.561 | −0.285 |
| 4 | 61*$I_0$ | 3*$I_0$ | 64*$I_0$ | −0.855 | −0.294 |
| 5 | 60*$I_0$ | 4*$I_0$ | 64*$I_0$ | −1.160 | −0.305 |
| 6 | 59*$I_0$ | 5*$I_0$ | 64*$I_0$ | −1.476 | −0.316 |
| 7 | 58*$I_0$ | 6*$I_0$ | 64*$I_0$ | −1.804 | −0.328 |
| 8 | 57*$I_0$ | 7*$I_0$ | 64*$I_0$ | −2.144 | −0.341 |
| 9 | 56*$I_0$ | 8*$I_0$ | 64*$I_0$ | −2.499 | −0.355 |
| 10 | 55*$I_0$ | 9*$I_0$ | 64*$I_0$ | −2.868 | −0.370 |
| 11 | 54*$I_0$ | 10*$I_0$ | 64*$I_0$ | −3.255 | −0.386 |
| 12 | 53*$I_0$ | 11*$I_0$ | 64*$I_0$ | −3.659 | −0.404 |
| 13 | 52*$I_0$ | 12*$I_0$ | 64*$I_0$ | −4.082 | −0.424 |
| 14 | 51*$I_0$ | 13*$I_0$ | 64*$I_0$ | −4.528 | −0.446 |
| 15 | 50*$I_0$ | 14*$I_0$ | 64*$I_0$ | −4.998 | −0.470 |

TABLE 1-continued

| Gain state (Gain state) | $I_{p2}/I_{n2}$ | $I_{n1}/I_{p1}$ | $I_{sum}$ | delta_Gain (dB) | Gain_step (dB) |
|---|---|---|---|---|---|
| 16 | $49*I_0$ | $15*I_0$ | $64*I_0$ | −5.494 | −0.496 |
| 17 | $48*I_0$ | $16*I_0$ | $64*I_0$ | −6.021 | −0.527 |
| 18 | $47*I_0$ | $17*I_0$ | $64*I_0$ | −6.581 | −0.561 |
| 19 | $46*I_0$ | $18*I_0$ | $64*I_0$ | −7.180 | −0.599 |
| 20 | $45*I_0$ | $19*I_0$ | $64*I_0$ | −7.824 | −0.644 |
| 21 | $44*I_0$ | $20*I_0$ | $64*I_0$ | −8.519 | −0.695 |
| 22 | $43*I_0$ | $21*I_0$ | $64*I_0$ | −9.275 | −0.756 |
| 23 | $42*I_0$ | $22*I_0$ | $64*I_0$ | −10.103 | −0.828 |
| 24 | $41*I_0$ | $23*I_0$ | $64*I_0$ | −11.018 | −0.915 |
| 25 | $40*I_0$ | $24*I_0$ | $64*I_0$ | −12.041 | −1.023 |
| 26 | $39*I_0$ | $25*I_0$ | $64*I_0$ | −13.201 | −1.160 |
| 27 | $38*I_0$ | $26*I_0$ | $64*I_0$ | −14.540 | −1.339 |
| 28 | $37*I_0$ | $27*I_0$ | $64*I_0$ | −16.124 | −1.584 |
| 29 | $36*I_0$ | $28*I_0$ | $64*I_0$ | −18.062 | −1.938 |
| 30 | $35*I_0$ | $29*I_0$ | $64*I_0$ | −20.561 | −2.499 |
| 31 | $34*I_0$ | $30*I_0$ | $64*I_0$ | −24.08 | −3.522 |
| 32 | $33*I_0$ | $31*I_0$ | $64*I_0$ | −30.103 | −6.021 |
| 33 (Gmin) | $32*I_0$ | $32*I_0$ | $64*I_0$ | | |

It can be seen from Table 1 that, when the 6-bit gain control is adopted, again of the differential input pair in the variable gain amplifier 30 transits from the maximum gain Gmax to the minimum gain Gmin, which may include 33 gain states in total, namely, gain states 1, 2, . . . 33. The gain state 1 represents the maximum gain Gmax of the differential input pair, the gain state 33 represents the minimum gain Gmin of the differential input pair, and the gain states 2 to 32 separately correspond to transition states from Gmax to Gmin. For ease of description below, again state Gmax and again state Gmin are also used. For details, refer to Table 1 and the description herein. Details are not described subsequently.

In Table 1, by comparing the gain state 1 and the gain state 33, it can be seen that a dynamic range of the gain change may reach about 30 decibels (dB). In addition, Gain_step of the variable gain amplifier 30 is mainly determined by a quantity of bits for gain control. Theoretically, a larger the quantity of bits for the gain control indicates more precise adjustment of Gain_step.

Further, it can be seen from Table 1 that, a bias current of one amplifying circuit of the differential input pair increments, while a bias current of the other amplifying circuit decrements. In addition, the current change of each level is fixed at $I_0$ when the current increments or decrements. When the dynamic range is large, Gain_step is also large. To make adjustment of Gain_step more precise, different current change amounts may be set for each level. In other words, a current distribution policy with unequal current steps is used. For example, when the dynamic range is large, a current change amount of each step may be reduced, to reduce Gain_step. If the current distribution policy with unequal current steps is used, linear (linear-dB) gain adjustment can be theoretically implemented.

The foregoing description is how the variable gain amplifier 30 implements the gain control. The following further describes a reason why linearity of a transistor deteriorates with a gain change, and an improved solution provided in this embodiment.

Figure 6:
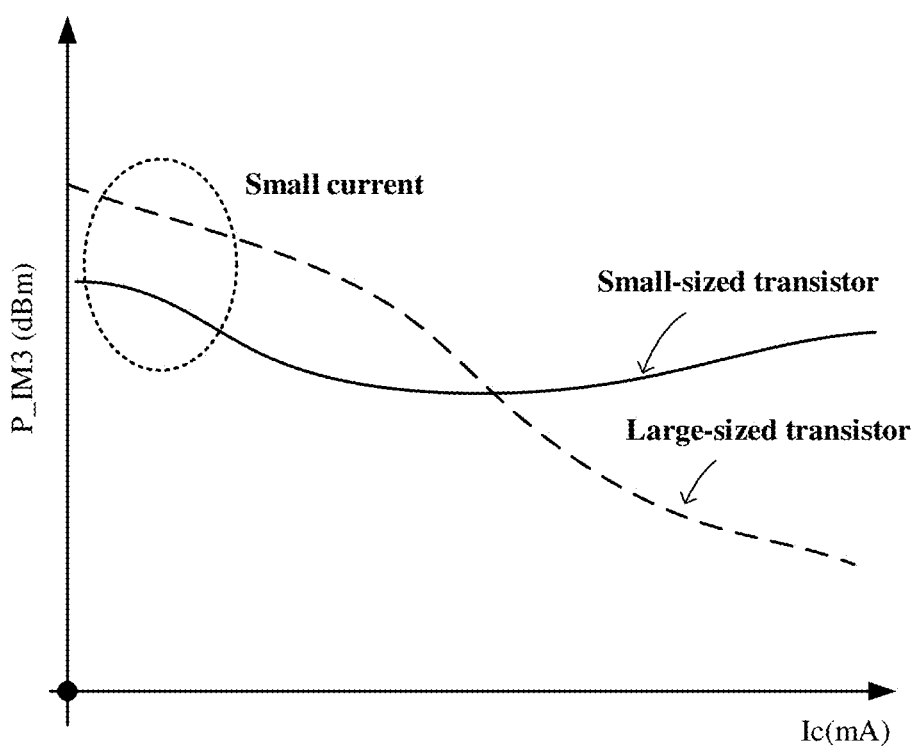
FIG. 6 is a schematic diagram of a relationship between a bias current of a transistor and third-order inter-modulation power.

In a radio frequency or microwave frequency band, when the bias current $I_c$ of the transistor is changed, a power (P_IM3) of a third-order inter-modulation signal output by the transistor changes as shown in FIG. 6. It can be seen that, when a size of the transistor is fixed, regardless of the large-sized transistor or the small-sized transistor, as the bias current $I_c$ increases, the third-order inter-modulation power P_IM3 of the transistor gradually decreases, and therefore relatively good linearity is presented. This is caused by different parasitic parameters of the transistor under different current density, which an inherent physical characteristic of the transistor. To be specific, a characteristic frequency $f_t$ of the transistor increases with current density of $I_c$. In a high-frequency application scenario, this phenomenon of a transistor is more obvious.

It can be seen from FIG. 6 that, when a bias current flowing through the transistor is relatively small, the third-order inter-modulation power of the transistor is relatively high, and correspondingly, the linearity is relatively poor. Therefore, the third-order inter-modulation power of the transistor becomes a key factor that restricts the linearity of the variable gain amplifier.

Figure 7:
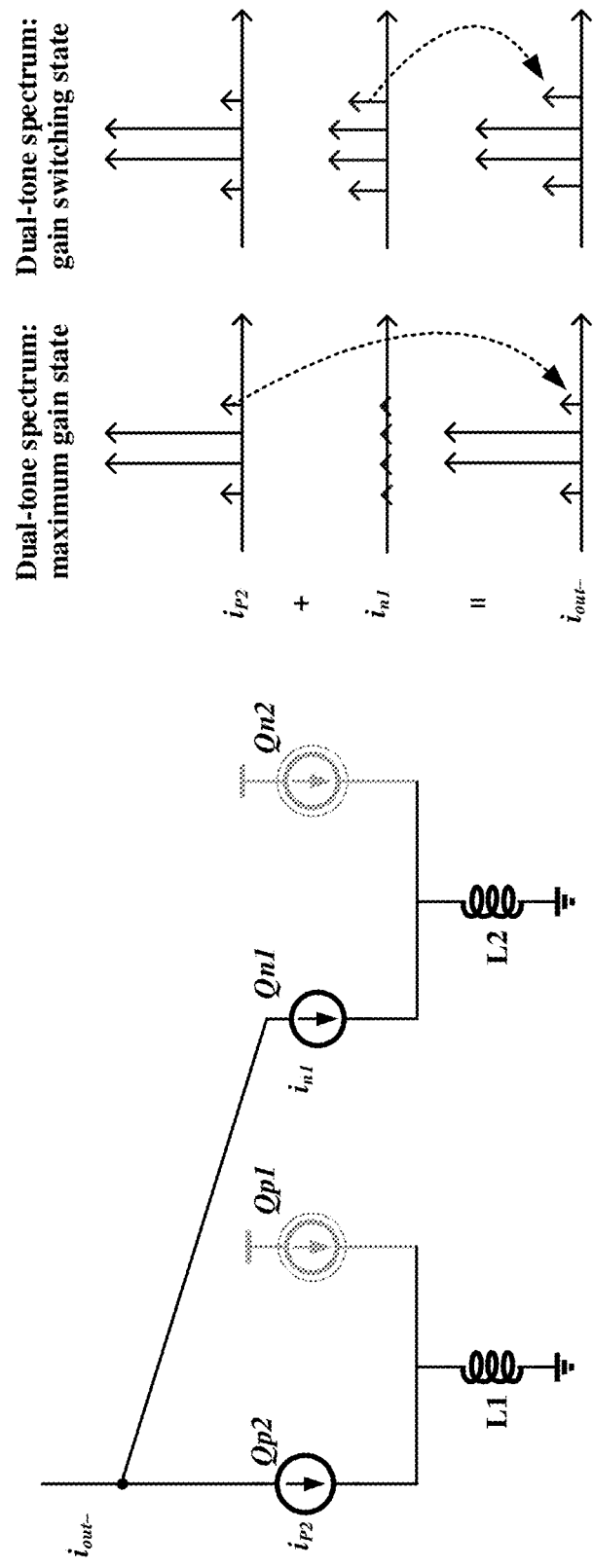
FIG. 7 is a schematic diagram of an equivalent circuit of the variable gain amplifier shown in FIG. 3a to FIG. 3c.

FIG. 7 shows an equivalent circuit of the variable gain amplifier 30 shown in FIG. 3a to FIG. 3c. As shown in FIG. 7, in the maximum gain state Gmax, the first amplifying circuit $Q_{p1}$ is turned off, all the bias currents flow through the second amplifying circuit $Q_{p2}$, and the linearity of the variable gain amplifier is determined by the second amplifying circuit $Q_{p2}$. When the bias current is relatively large, the third-order inter-modulation power of the second amplifying circuit $Q_{p2}$ is relatively low. In this case, the linearity of the variable gain amplifier 30 is relatively good. However, when the gain switches from the maximum gain state to a lower gain state, a bias current of the third amplifying circuit $Q_{n1}$ gradually increases from 0. In this case, because the bias current flowing through the third amplifying circuit $Q_{n1}$ is relatively small, the third amplifying circuit $Q_{n1}$ generates a relatively large third-order inter-modulation power. After the current $i_{n1}$ generated by the third amplifying circuit $Q_{n1}$ and the current $i_{p2}$ generated by the second amplifying circuit $Q_{p2}$ are combined to obtain $i_{out-}$, a third-order inter-modulation power of the entire variable gain amplifier is determined by the third amplifying circuit $Q_{n1}$. Because the bias current is relatively small, the linearity of the transistor is relatively poor, and consequently, the linearity of the variable gain amplifier 30 is reduced relative to the maximum gain state.

Figure 8:
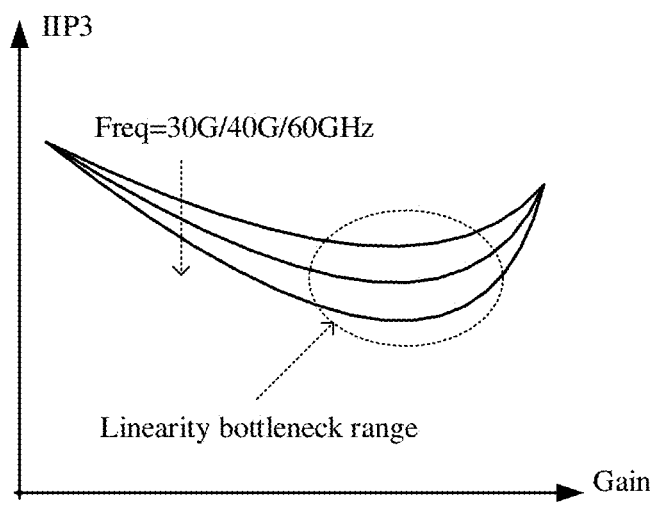
FIG. 8 is a schematic diagram of a linearity curve of a variable gain amplifier based on a transconductance stage circuit in the prior art.

Further, as shown in FIG. 8, when the variable gain amplifier implements gain switching by switching a Gm stage, within a certain range of switching downward from the highest gain state, the linearity of the variable gain amplifier is mainly determined by a transistor with a small current. As a result, an obvious pit of the linearity of the variable gain amplifier is displayed in the entire dynamic range (as shown in a linearity bottleneck range in FIG. 8). IIP3 is an input third-order intercept point, and Gain is the gain. Particularly, it can be seen from FIG. 8 that, as a frequency (Freq) increases (for example, 30 GHz→40 GHz→60 GHz), the linearity of the variable gain amplifier decreases more, and the pit is more obvious. This is an inherent defect of the variable gain amplifier shown in FIG. 3. When the transistor uses a MOS transistor or a bipolar junction transistor (BJT) technology, a same problem also exists. With the popularization of the fifth-generation mobile communications (5G) applications, a working frequency is continuously increased to the microwave frequency band. This problem will become more serious. To be specific, as the frequency increases, the linearity of the variable gain amplifier decreases more.

It can be seen from the foregoing analysis that a main reason why the linearity of the variable gain amplifier has a performance bottleneck is that a current flowing through a transistor of the variable gain amplifier is relatively small. It should be noted that, to better reflect superiority of the technical solutions of this application, in the foregoing descriptions of FIG. 6 to FIG. 8 and the corresponding gain control principles, it is assumed that the first amplifying circuit $Q_{p1}$, the second amplifying circuit $Q_{p2}$, the third amplifying circuit $Q_{n1}$, and the fourth amplifying circuit $Q_{n2}$ separately uses one transistor are described. Because in a conventional Gm-stage circuit, a differential input pair is formed by a pair of transistors.

In this embodiment, the first amplifying circuit $Q_{p1}$, the second amplifying circuit $Q_{p2}$, the third amplifying circuit $Q_{n1}$, and the fourth amplifying circuit $Q_{n2}$ are separately split into the plurality of parallel transistors. A bias of each transistor is controlled independently, a conduction current of each transistor is determined based on a specific gating policy, therefore a worst linearity point (namely, the pit) of the variable gain amplifier can be avoided. In addition, advantages of a large dynamic (delta_Gain) and a small step (Gain_step) of the variable gain amplifier during the gain control are maintained.

Figure 9:
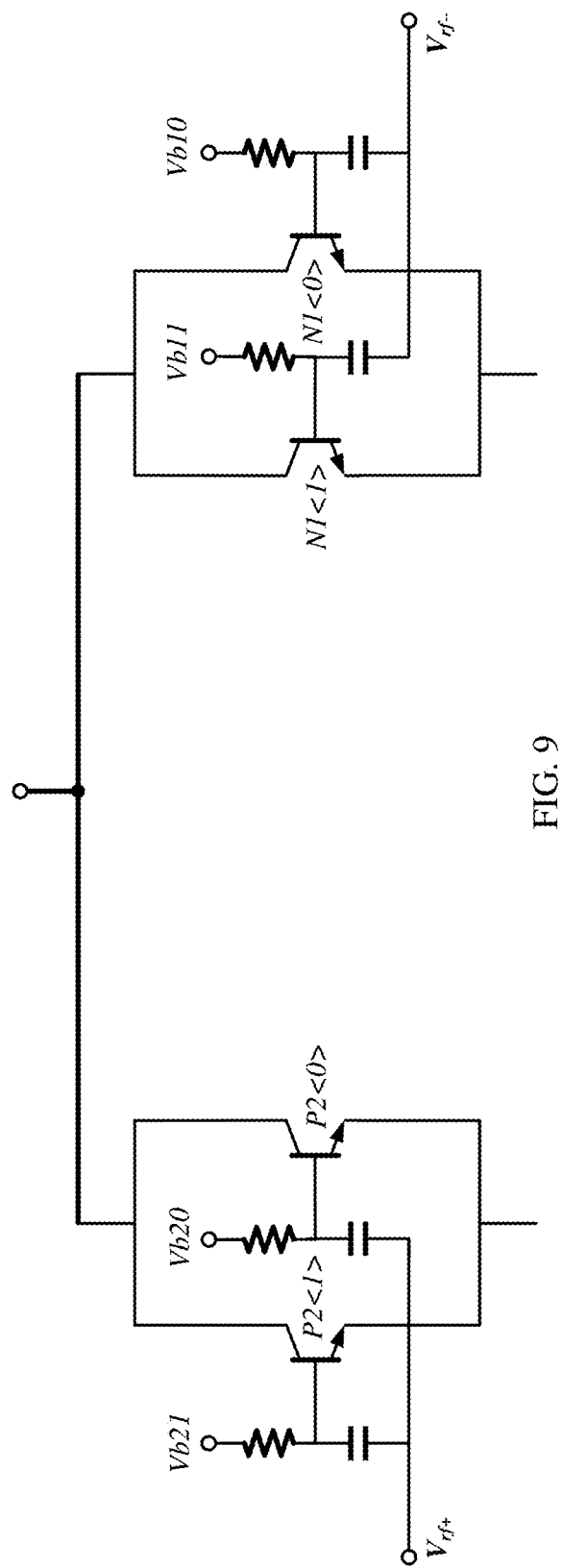
FIG. 9 is a schematic diagram of a half-side equivalent circuit of the variable gain amplifier shown in FIG. 3a to FIG. 3c.

FIG. 9 shows a half-side equivalent circuit corresponding to the second amplifying circuit $Q_{p2}$ and the third amplifying circuit $Q_{n1}$ in FIG. 3. The following describes a gating policy in detail with reference to FIG. 9.

It is assumed that in a conventional Gm-stage circuit, the second amplifying circuit $Q_{p2}$ and the third amplifying circuit $Q_{n1}$ each use one transistor, and sizes of the transistors are both W. For ease of description, the following describes a case in which each amplifying circuit in a conventional Gm-stage circuit uses one transistor by using a non-splitting manner for a transistor. Under each gain state of a variable gain amplifier, magnitudes of currents flowing through respective transistors of the second amplifying circuit $Q_{p2}$ and the third amplifying circuit $Q_{n1}$ are shown in Table 2. It should be noted that a current variation at each level in Table 2 is $I_0$ by default. For simplicity, only a number indicating a current magnitude is shown in the table. It should be known that, using a Gmax state as an example, a current $iQ_{p2}$ flowing through the second amplifying circuit $Q_{p2}$ should be $2^N * I_0$. Currents in a subsequent table are expressed in a similar manner. Details are not described again.

TABLE 2

|  | $Q_{p2}$ | $Q_{n1}$ | Gain state |
|---|---|---|---|
| Current | $2^N$ | 0 | Gmax |
|  | $2^N - 1$ | 1 | ... |
|  | $2^N - 2$ | 2 | Gmin |
|  | $2^N - 3$ | 3 |  |
|  | ... | ... |  |
|  | $2^N - 1$ | $2^N - 1$ |  |
| Size | W | W |  |

Refer to FIG. 3a, if the second amplifying circuit $Q_{p2}$ and the third amplifying circuit $Q_{n1}$ are equally split into two parts based on the transistor sizes, in other words, the second amplifying circuit $Q_{p2}$ is split into a transistor $Q_{P2<0>}$ and a transistor $Q_{p2<1>}$ that are connected in parallel, and the third amplifying circuit $Q_{n1}$ is split into a transistor $Q_{n1<0>}$ and a transistor $Q_{n1<1>}$ that are connected in parallel. Sizes of the transistor $Q_{P2<0>}$, the transistor $Q_{P2<1>}$, the transistor $Q_{n1<0>}$, and the transistor $Q_{n1<1>}$ are all W/2. In this case, in each gain state of the variable gain amplifier, magnitudes of currents that separately flow through the transistor $Q_{P2<0>}$, $Q_{p2<1>}$, $Q_{n1<0>}$, and $Q_{n1<1>}$ may be shown in Table 3.

TABLE 3

|  | $Q_{p2<1>}$ | $Q_{p2<0>}$ | $Q_{n1<1>}$ | $Q_{n1<0>}$ | Gain state |
|---|---|---|---|---|---|
| Current | $2^{N-1}$ | $2^{N-1}$ | 0 | 0 | Gmax |
|  | $2^{N-1}$ | $2^{N-1}-1$ | 0 | 1 | ... |
|  | $2^{N-1}$ | $2^{N-1}-2$ | 0 | 2 | Gmin |
|  | ... | ... | ... | ... |  |
|  | $2^{N-1}$ | 1 | 0 | $2^{N-1}-1$ |  |
|  | $2^{N-1}$ | 0 | 0 | $2^{N-1}$ |  |
| Size | W/2 | W/2 | W/2 | W/2 |  |

It can be seen from Table 3 that, in a current distribution policy provided in this embodiment, when a gain of any differential input pair (namely, $Q_{p2}$ and $Q_{n1}$, or $Q_{p1}$ and $Q_{n2}$) is switched, for example, when the current distribution policy is switched downward from a highest gain state, in the differential input pair, a total bias current output by the transistors in one amplifying circuit decrements, while a total bias current output by the transistors in the other amplifying circuit increments. A total current of the differential input pair remains unchanged. For example, in Table 3, a bias current output by the second amplifying circuit $Q_{p2}$ is $i_{Qp2}=i_{Qp2<1>}+i_{Qp2<0>}$, and a bias current output by the third amplifying circuit $Q_{n1}$ is $i_{Qn1}=i_{Qn1<1>}+i_{Qn1<0>}$, where $i_{Qp2}$ decrements, and $i_{Qn1}$ increments. An increment or decrement amplitude, namely, a step value of current adjustment, is $I_0$.

It can be seen from Table 3 that, when the gain state is switched from Gmax to Gmin, the second state in the table (refer to Table 1, Gmax is a first state, and the second state is equivalent to that a control bit corresponding to the gain state Gmax changes by 1 bit) is taken as an example, where, $i_{Qn1<1>}=0$, $i_{Qn1<0>}=1*I_0$. Compared with the second state in Table 2 (where $i_{Qn1}=1*I_0$), the total current $i_{Qn1}$ flowing through the third amplifying circuit $Q_{n1}$ remains unchanged and is still $1*I_0$. Because the transistor $Q_{n1<0>}$ and the transistor $Q_{n1<1>}$ are connected in parallel, and $i_{Qn1}=i_{Qn1<1>}+i_{Qn1<0>}$, a current relationship between another amplifying circuit and each of a plurality of transistors obtained after being split from the amplifying circuit is similar. Details are not described again. However, in Table 3, $1*I_0$ flows through only one transistor $Q_{n1<0>}$ in the third amplifying circuit $Q_{n1}$, the size of the transistor $Q_{n1<0>}$ is W/2, and the other transistor $Q_{n1<1>}$ is turned off. Therefore, it can be learned that, when the third amplifying circuit $Q_{n1}$ is split into the two parallel transistors, current density flowing through the third amplifying circuit $Q_{n1}$ is two times that in a case in which the third amplifying circuit $Q_{n1}$ is not split. It can be learned from FIG. 6 and the foregoing analysis that, for a same size, a larger current flowing through the transistor indicates a smaller third-order intermodulation power. Correspondingly, linearity is better. Therefore, in this embodiment, the amplifying circuit in which one transistor is used in a conventional solution is split into the two parallel transistors. This improves the current density in the amplifying circuit, and further improves the linearity of the variable gain amplifier.

Further, as shown in FIG. 3b and Table 4, if a transistor size of the amplifying circuit is equally split into four parts, for example, the second amplifying circuit $Q_{p2}$ is split, from one transistor in the conventional solution, into four transistors $Q_{p2<0>}$, $Q_{p2<1>}$, $Q_{p2<2>}$ and $Q_{p2<3>}$ that are connected in parallel, and the third amplifying circuit $Q_{n1}$ is split into four transistors $Q_{n1<0>}$, $Q_{n1<1>}$, $Q_{n1<2>}$ and $Q_{n1<3>}$ that are connected in parallel. Sizes of $Q_{p2<0>}$, $Q_{p2<1>}$, $Q_{p2<2>}$, $Q_{p2<3>}$, $Q_{n1<0>}$, $Q_{n1<1>}$, $Q_{n1<2>}$ and $Q_{n1<3>}$ are all W/4. Therefore, when a gain is switched from the highest state Gmax to the lowest state Gmin, magnitude of a current flowing through each transistor is shown in Table 4.

TABLE 4

| | $Q_{p2<3>}$ | $Q_{p2<2>}$ | $Q_{p2<1>}$ | $Q_{p2<0>}$ | $Q_{n1<3>}$ | $Q_{n1<2>}$ | $Q_{n1<1>}$ | $Q_{n1<0>}$ | Gain state |
|---|---|---|---|---|---|---|---|---|---|
| Current | $2^{N-2}$ | $2^{N-2}$ | $2^{N-2}$ | $2^{N-2}$ | 0 | 0 | 0 | 0 | Gmax |
| | $2^{N-2}$ | $2^{N-2}$ | $2^{N-2}$ | $2^{N-2}-1$ | 0 | 0 | 0 | 1 | |
| | $2^{N-2}$ | $2^{N-2}$ | $2^{N-2}$ | $2^{N-2}-2$ | 0 | 0 | 0 | 2 | |
| | ... | | | | ... | | | | |
| | $2^{N-2}$ | $2^{N-2}$ | $2^{N-2}$ | $2^{N-2}$ | 0 | 0 | 0 | $2^{N-2}$ | |
| | $2^{N-2}$ | $2^{N-2}$ | $2^{N-2}$ | $2^{N-2}-1$ | 0 | 0 | 1 | $2^{N-2}$ | |
| | $2^{N-2}$ | $2^{N-2}$ | $2^{N-2}$ | $2^{N-2}-2$ | 0 | 0 | 2 | $2^{N-2}$ | |
| | ... | | | | ... | | | | |
| | $2^{N-2}$ | $2^{N-2}$ | 0 | 0 | 0 | 0 | $2^{N-2}$ | $2^{N-2}$ | Gmin |
| Size | W/4 | W/4 | W/4 | W/4 | W/4 | W/4 | W/4 | W/4 | |

It can be learned from the table that, for example, when the gain state changes from the first state (Gmax) to the second state, the current $i_{Qn1}$ flowing through the third amplifying circuit $Q_{n1}$ remains unchanged and is still $1*I_0$. However, $1*I_0$ flows through only ¼ of the transistors, and the other ¾ of the transistors are turned off. Therefore, current density flowing through $Q_{n1}$ is four times that in a case in which the third amplifying circuit $Q_{n1}$ is not split. It can be learned from the foregoing analysis that, compared with the bias current flowing through the second amplifying circuit $Q_{p2}$, the bias current flowing through the third amplifying circuit $Q_{n1}$ is relatively small. After the current $iQ_{n1}$ generated by the third amplifying circuit $Q_{n1}$ and the current $i_{Qp2}$ generated by the second amplifying circuit $Q_{p2}$ are combined to obtain $i_{out-}$, a third-order inter-modulation power of the entire variable gain amplifier is determined by the third amplifying circuit $Q_{n1}$. After the third amplifying circuit $Q_{n1}$ is split into four equal parts, because the current density of the third amplifying circuit $Q_{n1}$ is higher than that in the case in which the third amplifying circuit $Q_{n1}$ is not split, correspondingly, a third-order inter-modulation power corresponding to the third amplifying circuit $Q_{n1}$ is reduced. This further improves the linearity of the variable gain amplifier.

Figure 10:
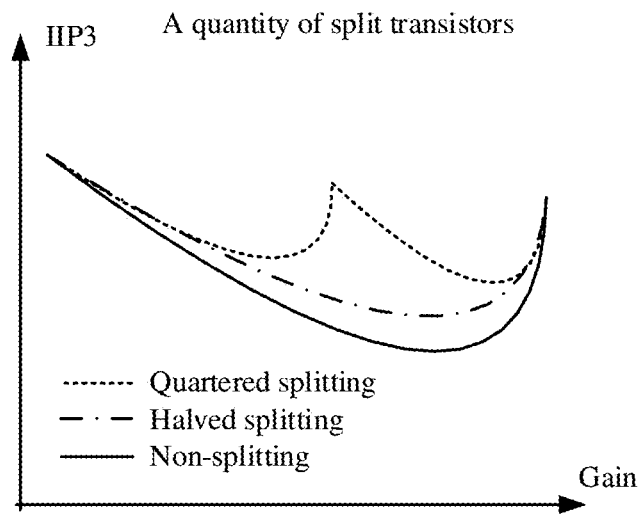
FIG. 10 is a schematic diagram of a linearity curve of a variable gain amplifier in a halved splitting manner, a quartered splitting manner, and a conventional non-splitting manner according to an embodiment of this application.

Further, FIG. 10 shows a comparison curve of linearity of a variable gain amplifier in several cases such as in a halved splitting manner, a quartered splitting manner, and a non-splitting manner. It can be seen that, as a quantity of transistors after splitting increases, a problem that a pit exists when linearity of the VGA is switched with a gain is avoided. In this way, the performance bottleneck of the linearity of the VGA within a dynamic gain range is broken through, and overall circuit performance is improved. By analogy, the amplifying circuit may be split into 2N groups (N=1, 2, 3 . . . ) of transistors. After the splitting, the linearity of the VGA increases in sequence, where N is a positive integer.

In this embodiment, when a transistor size is split into four parts, an unequal splitting manner may further be used. For example, a second amplifying circuit $Q_{p2}$ may be split into four transistors $Q_{p2<0>}$, $Q_{p2<1>}$, $Q_{p2<2>}$, and $Q_{p2<3>}$ that are connected in parallel. Sizes of the four transistors are sequentially W/8, W/8, W/4, W/2. In addition, a third amplifying circuit $Q_{n1}$ is split into four transistors $Q_{n1<0>}$, $Q_{n1<1>}$, $Q_{n1<2>}$, and $Q_{n1<3>}$ that are connected in parallel. Sizes of the four transistors are also sequentially W/8, W/8, W/4 and W/2. When a VGA gain is switched from a highest state to a lowest state, for magnitude of a current flowing through each transistor, refer to Table 5.

TABLE 5

| | $Q_{p2<3>}$ | $Q_{p2<2>}$ | $Q_{p2<1>}$ | $Q_{p2<0>}$ | $Q_{n1<3>}$ | $Q_{n1<2>}$ | $Q_{n1<1>}$ | $Q_{n1<0>}$ | Gain state |
|---|---|---|---|---|---|---|---|---|---|
| Current | $2^{N-2}$ | $2^{N-2}$ | $2^{N-2}$ | $2^{N-2}$ | 0 | 0 | 0 | 0 | Gmax |
| | $2^{N-2}$ | $2^{N-2}$ | $2^{N-2}$ | $2^{N-2}-1$ | 0 | 0 | 0 | 1 | |
| | $2^{N-2}$ | $2^{N-2}$ | $2^{N-2}$ | $2^{N-2}-2$ | 0 | 0 | 0 | 2 | |
| | ... | | | | ... | | | | |
| | $2^{N-2}$ | $2^{N-2}$ | $2^{N-2}$ | $2^{N-2}$ | 0 | 0 | 0 | $2^{N-2}$ | |
| | $2^{N-2}$ | $2^{N-2}$ | $2^{N-2}$ | $2^{N-2}-1$ | 0 | 0 | 1 | $2^{N-2}$ | |
| | $2^{N-2}$ | $2^{N-2}$ | $2^{N-2}$ | $2^{N-2}-2$ | 0 | 0 | 2 | $2^{N-2}$ | |
| | ... | | | | ... | | | | |
| | $2^{N-2}$ | $2^{N-2}$ | 0 | 0 | 0 | 0 | $2^{N-2}$ | $2^{N-2}$ | Gmin |
| Size | W/2 | W/4 | W/8 | W/8 | W/2 | W/4 | W/8 | W/8 | |

It can be seen that, in a second gain state (in other words, the gain state decreases by 1 bit from Gmax), a total current $iQ_{n1}$ flowing through the third amplifying circuit $Q_{n1}$ remains unchanged and is still $1*I_0$. However, $1*I_0$ flows through only the transistor $Q_{n1<0>}$, and the size of $Q_{n1<0>}$ is W/8, which is equivalent to that $1*I_0$ flows through only ⅛ of the transistors in the third amplifying circuit $Q_{n1}$, and the other ⅞ of the transistors are turned off. Therefore, current density of the total current $i_{Qn1}$ flowing through the third amplifying circuit $Q_{n1}$ is eight times that in a case in which the third amplifying circuit $Q_{n1}$ is not split. In addition, compared with the quartered splitting manner of the third amplifying circuit $Q_{n1}$, the current density is also improved by two times. Therefore, a non-quartered splitting manner can further improve the linearity of the VGA.

Figure 11:
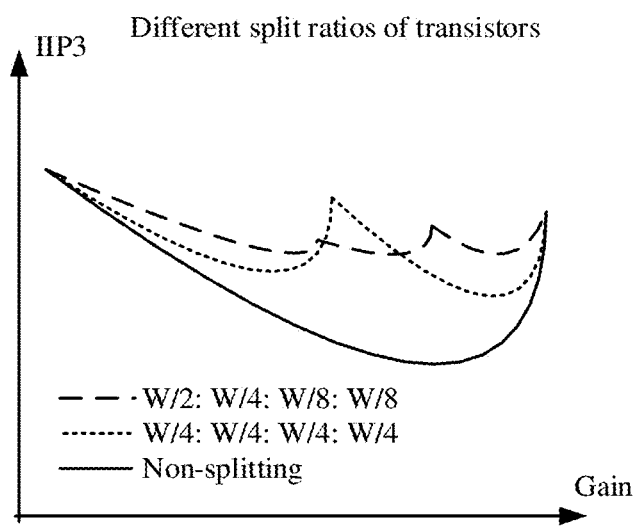
FIG. 11 is a schematic diagram of a linearity curve of a variable gain amplifier in a quartered splitting manner, an unequal splitting manner, and a conventional non-splitting manner according to an embodiment of this application.

FIG. 11 shows a comparison curve of the linearity of the variable gain amplifier in the non-splitting manner, the quartered splitting manner, and the non-quartered splitting manner. It can be seen that, compared with the non-splitting manner or the quartered splitting manner on the transistor size, the non-quartered splitting manner can better avoid the problem that the pit exists when the linearity of the VGA is switched with the gain, and further improve the linearity.

By analogy, the amplifying circuit may be split from a conventional transistor into 2N (N=1, 2, 3 . . . ) parallel transistors. A size proportion of the 2N transistors may be adjusted based on a design requirement, to achieve an optimal linearity improvement effect. For example, four transistors that are connected in parallel are used as an example. As shown in Table 6, this embodiment provides several different split ratios.

TABLE 6

| 2N = 4 | $Q_{p2<3>}$ | $Q_{p2<2>}$ | $Q_{p2<2>}$ | $Q_{p2<2>}$ | Total size |
|---|---|---|---|---|---|
| Split ratio 1 | W/4 | W/4 | W/4 | W/4 | W |
| Split ratio 2 | W/2 | W/4 | W/8 | W/8 | W |
| Split ratio 3 | 3W/4 | W/8 | W/16 | W/16 | W |

Figure 12:
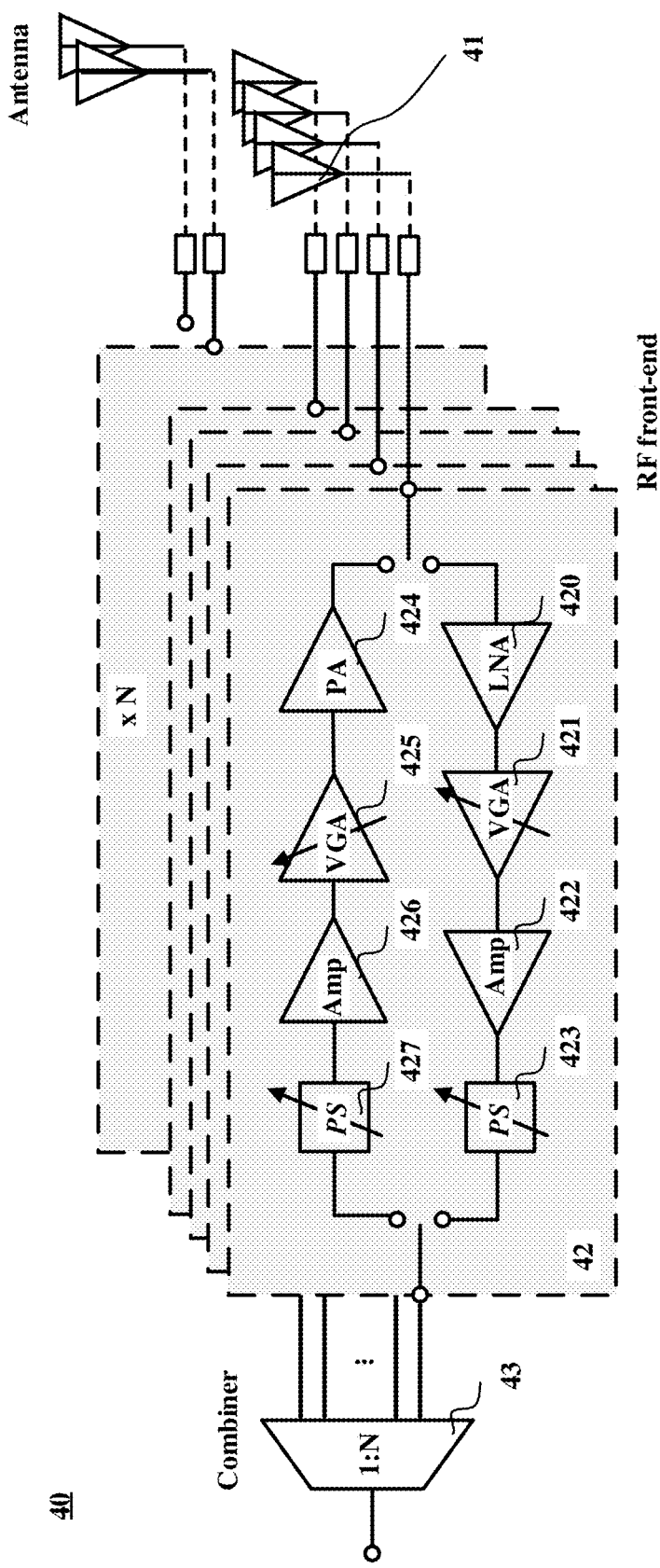
FIG. 12 is a schematic diagram of a structure of an electronic apparatus according to an embodiment of this application.

Further, as shown in FIG. 12, an embodiment of this application further provides an electronic apparatus 40. Specifically, the electronic apparatus 40 may be a phased array receiver, a phased array transmitter, or a phased array transceiver. Alternatively, the electronic apparatus 40 may be an electronic device to which the phased array receiver, the phased array transmitter, or the phased array transmitter is applied, for example, a mobile phone, a base station, or a personal computer. The electronic device 40 includes a plurality of antennas 41, a radio frequency front-end 42, and a combiner 43.

For example, the plurality of antennas 41 may be an antenna 1, an antenna 2, . . . , and an antenna N, where N is a positive integer greater than 1.

The radio frequency front-end 42 includes a plurality of radio frequency channels 42 that one-to-one correspond to the plurality of antennas 41, and the plurality of radio frequency channels 42 are separately coupled to the plurality of antennas 41. Each radio frequency channel includes at least one of a radio frequency receive channel or a radio frequency transmit channel, and the radio frequency receive channel or the radio frequency transmit channel separately includes the variable gain amplifier described in the foregoing embodiments. For a structure of the variable gain amplifier, refer to the foregoing embodiments. Details are not described herein again. In other words, if the electronic apparatus 40 is the phased array transmitter, each radio frequency channel includes the radio frequency transmit channel. If the electronic apparatus 40 is the phased array receiver, correspondingly, each radio frequency channel includes the radio frequency receive channel. If the electronic apparatus 40 is the phased array transceiver that integrates receiving and transmitting functions, each radio frequency channel includes the radio frequency receive channel and the radio frequency transmit channel.

The combiner 43 is coupled to the plurality of radio frequency channels 42.

Specifically, as shown in FIG. 11, the radio frequency receive channel may include a low-noise amplifier (LNA) 420, a variable gain amplifier (VGA) 421, an amplifier (Amp) 422, and a phase shifter (PS) 423. An input end of the LNA 420 is coupled to an antenna corresponding to the radio frequency receive channel, and an output end of the LNA 420 is coupled to an input end of the VGA 421. An output end of the VGA 421 is coupled to an input end of the amplifier 422, and an output end of the amplifier 422 is coupled to an input end of the phase shifter 423. An output end of the phase shifter 423 is coupled to the combiner 43. The LNA 420 is configured to amplify a weak signal received from the air by the antenna corresponding to the radio frequency receive channel, and reduce noise interference. The signal processed by the LNA 420 is further amplified by the VGA 421 and the amplifier 422, and then phase modulation is performed by the phase shifter 423.

The radio frequency transmit channel may include a power amplifier (PA) 424, a VGA 425, an amplifier 426, and a phase shifter (PS) 427. An input end of the phase shifter 427 is coupled to the combiner 43, and an output end of the phase shifter 427 is coupled to an input end of the amplifier 426. An output end of the amplifier 426 is coupled to an input end of the variable gain amplifier 425, and an output end of the variable gain amplifier 425 is coupled to an input end of the power amplifier 424. An output end of the power amplifier 424 is coupled to an antenna corresponding to the radio frequency transmit channel. The phase shifter 427 is configured to perform phase modulation on one of a plurality of signals output by the combiner 43, and then the signal is amplified by the amplifier 426 and the VGA 425. Finally, the PA 424 amplifies the signal processed by the amplifier 426 and the VGA 425 to sufficient power, and then transmits the signal through the antenna 41.

In the phased array transmitter, the combiner 43 is configured to divide an up-converted RF signal into a plurality of signals, and provide the plurality of signals for each radio frequency transmit channel. In the phased array receiver, the combiner 43 is configured to combine signals obtained after phase modulation is performed on the plurality of radio frequency receive channels, and then provide the combined signals for a next-stage circuit for down conversion.

In this embodiment, because the VGAs 421 or 425 used can maintain good linearity in different gain states, the VGAs can not only amplify a signal, but also keep a phase of the amplified signal constant. Therefore, deterioration of performance of the phase shifters PS423 or 427 can be avoided or reduced, and a requirement of the electronic apparatus 40 for a constant phase can be met.

Obviously, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A variable gain amplifier, comprising:
a first transconductance stage circuit, comprising a first amplifying circuit and a second amplifying circuit; and
a second transconductance stage circuit, comprising a third amplifying circuit and a fourth amplifying circuit;
wherein the first amplifying circuit and the fourth amplifying circuit form a first differential input pair, and wherein the second amplifying circuit and the third amplifying circuit form a second differential input pair; and
wherein each amplifying circuit of the first amplifying circuit, the second amplifying circuit, the third amplifying circuit, and the fourth amplifying circuit comprises a plurality of parallel transistors, and wherein bias control of each transistor of the plurality of parallel transistors of the respective amplifying circuit is independent of bias control of each other transistor of the respective plurality of parallel transistors.

2. The variable gain amplifier according to claim 1, wherein the first amplifying circuit, the second amplifying circuit, the third amplifying circuit, and the fourth amplifying circuit have a same structure.

3. The variable gain amplifier according to claim 1, wherein bias currents separately output by the first amplifying circuit, the second amplifying circuit, the third amplifying circuit, and the fourth amplifying circuit meet the following condition:

$$|i_{p2}+i_{n1}|=|i_{n2}+i_{p1}|=C;$$

wherein $i_{p1}$ is the bias current output by the first amplifying circuit, wherein $i_{p2}$ is the bias current output by the second amplifying circuit, wherein $i_{n1}$ is the bias current output by the third amplifying circuit, wherein $i_{n2}$ is the bias current output by the fourth amplifying circuit, and wherein C is a constant.

4. The variable gain amplifier according to claim 3, wherein, when the variable gain amplifier performs gain switching, a bias current output by an amplifying circuit of at least one of the first differential input pair or the second differential input pair decrements, and a bias current output by the other amplifying circuit of the at least one of the first differential input pair or the second differential input pair increments.

5. The variable gain amplifier according to claim 1, further comprising:
a first degeneration circuit; and
a second degeneration circuit, wherein the first degeneration circuit is configured to change linearity of a bias current output by each transistor in the first transconductance stage circuit, and wherein the second degeneration circuit is configured to change linearity of a bias current output by each transistor in the second transconductance stage circuit.

19

6. The variable gain amplifier according to claim 5, wherein at least one of the first degeneration circuit or the second degeneration circuit comprises at least one of a resistor or an inductor.

7. The variable gain amplifier according to claim 5, wherein the plurality of transistors is a plurality of triodes.

8. The variable gain amplifier according to claim 7, wherein in each of the first amplifying circuit, the second amplifying circuit, the third amplifying circuit, and the fourth amplifying circuit, bases of the plurality of transistors are configured to separately receive an input voltage, emitters of the plurality of transistors are separately coupled to ground through at least one of the first degeneration circuit or the second degeneration circuit, and collectors of the plurality of transistors are short-circuited together and are configured to output a bias current.

9. The variable gain amplifier according to claim 5, wherein the plurality of transistors are metal-oxide semiconductor (MOS) transistors.

10. The variable gain amplifier according to claim 9, wherein in each of the first amplifying circuit, the second amplifying circuit, the third amplifying circuit, and the fourth amplifying circuit, gates of the plurality of transistors are configured to separately receive an input voltage, sources of the plurality of transistors are separately coupled to ground through at least one of the first degeneration circuit or the second degeneration circuit, and drains of the plurality of transistors are short-circuited together and are configured to output a bias current.

11. A detection apparatus, comprising:
a radio frequency front-end, comprising a plurality of radio frequency channels that correspond, in a one-to-one arrangement, to a plurality of antennas, wherein radio frequency channels of the plurality of radio frequency channels are separately coupled to the plurality of antennas, wherein each radio frequency channel of the plurality of radio frequency channels comprises at least one of a radio frequency receive channel or a radio frequency transmit channel, and wherein the at least one of the radio frequency receive channel or the radio frequency transmit channel separately comprises a variable gain amplifier; and
a combiner, separately coupled to the plurality of radio frequency channels;
wherein the variable gain amplifier of each radio frequency channel of the plurality of radio frequency channels comprises:
a first transconductance stage circuit, comprising a first amplifying circuit and a second amplifying circuit; and
a second transconductance stage circuit, comprising a third amplifying circuit and a fourth amplifying circuit, wherein the first amplifying circuit and the fourth amplifying circuit form a first differential input pair, and wherein the second amplifying circuit and the third amplifying circuit form a second differential input pair; and
wherein each amplifying circuit of the first amplifying circuit, the second amplifying circuit, the third amplifying circuit, and the fourth amplifying circuit comprises a plurality of parallel transistors, and wherein bias control of each transistor of the plurality of parallel transistors of the respective amplifying circuit is independent of bias control each other transistor of the plurality of parallel transistors.

12. The detection apparatus according to claim 11, wherein each radio frequency receive channel further comprises:

20 a low-noise amplifier, wherein an input end of the low-noise amplifier is coupled to an antenna corresponding to the radio frequency receive channel, and wherein an output end of the low-noise amplifier is coupled to an input end of the variable gain amplifier;
an amplifier, wherein an output end of the variable gain amplifier is coupled to an input end of the amplifier; and
a phase shifter, wherein an output end of the amplifier is coupled to an input end of the phase shifter, and wherein an output end of the phase shifter is coupled to the combiner.

13. The detection apparatus according to claim 11, wherein the radio frequency transmit channel further comprises:
a power amplifier, wherein an output end of the variable gain amplifier is coupled to an input end of the power amplifier, and wherein an output end of the power amplifier is coupled to an antenna corresponding to the radio frequency transmit channel;
an amplifier, wherein an output end of the amplifier is coupled to an input end of the variable gain amplifier; and
a phase shifter, wherein an input end of the phase shifter is coupled to the combiner, and wherein an output end of the phase shifter is coupled to an input end of the amplifier.

14. The detection apparatus according to claim 11, wherein the detection apparatus is at least one of a phased array receiver, a phased array transmitter, or a phased array transceiver.

15. A variable gain amplifier, comprising:
a first amplifying circuit;
a second amplifying circuit;
a third amplifying circuit; and
a fourth amplifying circuit;
wherein the first amplifying circuit and the fourth amplifying circuit form a first differential input pair, and wherein the second amplifying circuit and the third amplifying circuit form a second differential input pair; and
wherein each amplifying circuit of the first amplifying circuit, the second amplifying circuit, the third amplifying circuit, and the fourth amplifying circuit comprises a plurality of parallel transistors, and wherein bias control of each transistor of the plurality of parallel transistors of the respective amplifying circuit is independent of bias control of each other transistor of the respective plurality of parallel transistors.

16. The variable gain amplifier according to claim 15, wherein the first amplifying circuit, the second amplifying circuit, the third amplifying circuit, and the fourth amplifying circuit have a same circuit structure.

17. The variable gain amplifier according to claim 15, wherein, when the variable gain amplifier performs gain switching, a bias current output by an amplifying circuit of at least one of the first differential input pair or the second differential input pair decrements, and a bias current output by the other amplifying circuit of the at least one of the first differential input pair or the second differential input pair increments.

18. The variable gain amplifier according to claim 15, further comprising:
a first degeneration circuit; and
a second degeneration circuit, wherein the first degeneration circuit is configured to change linearity of a bias current output by each transistor in the first amplifying circuit and second amplifying circuit, and wherein the second degeneration circuit is configured to change linearity of a bias current output by each transistor in the third amplifying circuit and fourth amplifying circuit.

19. The variable gain amplifier according to claim 18, wherein in each of the first amplifying circuit, the second amplifying circuit, the third amplifying circuit, and the fourth amplifying circuit, bases of the plurality of transistors are configured to separately receive an input voltage, wherein emitters of the plurality of transistors are separately coupled to ground through at least one of the first degeneration circuit or the second degeneration circuit, and wherein collectors of the plurality of transistors are short-circuited together and are configured to output a bias current.

20. The variable gain amplifier according to claim 18, wherein in each of the first amplifying circuit, the second amplifying circuit, the third amplifying circuit, and the fourth amplifying circuit, gates of the plurality of transistors are configured to separately receive an input voltage, sources of the plurality of transistors are separately coupled to ground through at least one of the first degeneration circuit or the second degeneration circuit, and drains of the plurality of transistors are short-circuited together and are configured to output a bias current.

* * * * *